US008050086B2

(12) United States Patent
Shalvi et al.

(10) Patent No.: US 8,050,086 B2
(45) Date of Patent: Nov. 1, 2011

(54) DISTORTION ESTIMATION AND CANCELLATION IN MEMORY DEVICES

(75) Inventors: Ofir Shalvi, Ra'anana (IL); Naftali Sommer, Rishon Le-Zion (IL); Eyal Gurgi, Petah-Tikva (IL); Ariel Maislos, Sunnyvale, CA (US)

(73) Assignee: Anobit Technologies Ltd., Herzlipa Pituach (IL)

( * ) Notice: Subject to any disclaimer, the term of this patent is extended or adjusted under 35 U.S.C. 154(b) by 677 days.

(21) Appl. No.: 11/995,801

(22) PCT Filed: May 10, 2007

(86) PCT No.: PCT/IL2007/000576
§ 371 (c)(1),
(2), (4) Date: Jan. 15, 2008

(87) PCT Pub. No.: WO2007/132453
PCT Pub. Date: Nov. 22, 2007

(65) Prior Publication Data
US 2008/0198650 A1     Aug. 21, 2008

Related U.S. Application Data

(60) Provisional application No. 60/747,106, filed on May 12, 2006, provisional application No. 60/806,533, filed on Jul. 4, 2006, provisional application No. 60/827,067, filed on Sep. 27, 2006, provisional application No. 60/867,399, filed on Nov. 28, 2006, provisional application No. 60/885,024, filed on Jan. 16, 2007, provisional application No. 60/886,429, filed on Jan. 24, 2007.

(51) Int. Cl.
*G11C 11/34* (2006.01)
*G11C 16/04* (2006.01)
*G11C 16/06* (2006.01)

(52) U.S. Cl. ......... 365/185.02; 365/185.09; 365/185.03; 711/103

(58) Field of Classification Search ............. 365/185.02, 365/185.03, 185.09; 711/103; 714/721
See application file for complete search history.

(56) References Cited

U.S. PATENT DOCUMENTS

| 4,556,961 A | 12/1985 | Iwahashi et al. |
| 4,558,431 A | 12/1985 | Satoh et al. |

(Continued)

FOREIGN PATENT DOCUMENTS

EP     0783754 B1     7/1997

(Continued)

OTHER PUBLICATIONS

U.S. Appl. No. 12/019,011 Official Action dated Nov. 20, 2009.

(Continued)

*Primary Examiner* — J. H. Hur
(74) *Attorney, Agent, or Firm* — D. Kligler I.P. Services Ltd.

(57) ABSTRACT

A method for operating a memory (28) includes storing data in a group of analog memory cells (32) of the memory as respective first voltage levels. After storing the data, second voltage levels are read from the respective analog memory cells. The second voltage levels are affected by cross-coupling interference causing the second voltage levels to differ from the respective first voltage levels. Cross-coupling coefficients, which quantify the cross-coupling interference among the analog memory cells, are estimated by processing the second voltage levels. The data stored in the group of analog memory cells is reconstructed from the read second voltage levels using the estimated cross-coupling coefficients.

26 Claims, 6 Drawing Sheets

U.S. PATENT DOCUMENTS

| | | | |
|---|---|---|---|
| 4,661,929 A | 4/1987 | Aoki et al. | |
| 4,768,171 A | 8/1988 | Tada | |
| 4,811,285 A | 3/1989 | Walker et al. | |
| 4,899,342 A | 2/1990 | Potter et al. | |
| 4,910,706 A | 3/1990 | Hyatt | |
| 4,993,029 A | 2/1991 | Galbraith et al. | |
| 5,056,089 A | 10/1991 | Furuta et al. | |
| 5,077,722 A | 12/1991 | Geist et al. | |
| 5,126,808 A | 6/1992 | Montalvo et al. | |
| 5,163,021 A | 11/1992 | Mehrotra et al. | |
| 5,172,338 A | 12/1992 | Mehrotta et al. | |
| 5,191,584 A | 3/1993 | Anderson | |
| 5,200,959 A | 4/1993 | Gross et al. | |
| 5,237,535 A | 8/1993 | Mielke et al. | |
| 5,272,669 A | 12/1993 | Samachisa et al. | |
| 5,276,649 A | 1/1994 | Hoshita et al. | |
| 5,287,469 A | 2/1994 | Tsuboi | |
| 5,365,484 A | 11/1994 | Cleveland et al. | |
| 5,388,064 A | 2/1995 | Khan | |
| 5,416,646 A | 5/1995 | Shirai | |
| 5,416,782 A | 5/1995 | Wells et al. | |
| 5,473,753 A | 12/1995 | Wells et al. | |
| 5,479,170 A | 12/1995 | Cauwenberghs et al. | |
| 5,508,958 A | 4/1996 | Fazio et al. | |
| 5,519,831 A | 5/1996 | Holzhammer | |
| 5,532,962 A | 7/1996 | Auclair et al. | |
| 5,541,886 A | 7/1996 | Hasbun | |
| 5,600,677 A | 2/1997 | Citta et al. | |
| 5,638,320 A | 6/1997 | Wong et al. | |
| 5,657,332 A | 8/1997 | Auclair et al. | |
| 5,675,540 A | 10/1997 | Roohparvar et al. | |
| 5,682,352 A | 10/1997 | Wong et al. | |
| 5,687,114 A | 11/1997 | Khan | |
| 5,696,717 A | 12/1997 | Koh | |
| 5,726,649 A | 3/1998 | Tamaru et al. | |
| 5,726,934 A | 3/1998 | Tran et al. | |
| 5,742,752 A | 4/1998 | De Koning | |
| 5,748,533 A | 5/1998 | Dunlap et al. | |
| 5,748,534 A | 5/1998 | Dunlap et al. | |
| 5,751,637 A | 5/1998 | Chen et al. | |
| 5,761,402 A | 6/1998 | Kaneda et al. | |
| 5,798,966 A | 8/1998 | Keeney | |
| 5,801,985 A | 9/1998 | Roohparvar et al. | |
| 5,838,832 A | 11/1998 | Barnsley | |
| 5,860,106 A | 1/1999 | Domen et al. | |
| 5,867,114 A | 2/1999 | Barbir | |
| 5,867,429 A | 2/1999 | Chen et al. | |
| 5,877,986 A | 3/1999 | Harari et al. | |
| 5,889,937 A | 3/1999 | Tamagawa | |
| 5,901,089 A | 5/1999 | Korsh et al. | |
| 5,909,449 A | 6/1999 | So et al. | |
| 5,912,906 A | 6/1999 | Wu et al. | |
| 5,930,167 A | 7/1999 | Lee et al. | |
| 5,937,424 A | 8/1999 | Leak et al. | |
| 5,942,004 A | 8/1999 | Cappelletti | |
| 5,969,986 A | 10/1999 | Wong et al. | |
| 5,991,517 A | 11/1999 | Harari et al. | |
| 5,995,417 A | 11/1999 | Chen et al. | |
| 6,009,014 A | 12/1999 | Hollmer et al. | |
| 6,034,891 A | 3/2000 | Norman | |
| 6,040,993 A | 3/2000 | Chen et al. | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,141,261 A | 10/2000 | Patti | |
| 6,166,962 A | 12/2000 | Chen et al. | |
| 6,178,466 B1 | 1/2001 | Gilbertson et al. | |
| 6,185,134 B1 | 2/2001 | Tanaka et al. | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee et al. | |
| 6,222,762 B1 | 4/2001 | Guterman et al. | |
| 6,230,233 B1 | 5/2001 | Lofgren et al. | |
| 6,240,458 B1 | 5/2001 | Gilbertson | |
| 6,275,419 B1 | 8/2001 | Guterman et al. | |
| 6,279,069 B1 | 8/2001 | Robinson et al. | |
| 6,288,944 B1 | 9/2001 | Kawamura | |
| 6,292,394 B1 | 9/2001 | Cohen et al. | |
| 6,301,151 B1 | 10/2001 | Engh et al. | |
| 6,304,486 B1 | 10/2001 | Yano | |
| 6,307,776 B1 | 10/2001 | So et al. | |
| 6,317,363 B1 | 11/2001 | Guterman et al. | |
| 6,317,364 B1 | 11/2001 | Guterman et al. | |
| 6,345,004 B1 | 2/2002 | Omura et al. | |
| 6,360,346 B1 | 3/2002 | Miyauchi et al. | |
| 6,363,008 B1 | 3/2002 | Wong | |
| 6,363,454 B1 | 3/2002 | Lakhani et al. | |
| 6,366,496 B1 | 4/2002 | Torelli et al. | |
| 6,396,742 B1 | 5/2002 | Korsh et al. | |
| 6,397,364 B1 | 5/2002 | Barkan | |
| 6,405,323 B1 | 6/2002 | Lin et al. | |
| 6,418,060 B1 | 7/2002 | Yong et al. | |
| 6,442,585 B1 | 8/2002 | Dean et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,522,580 B2 | 2/2003 | Chen et al. | |
| 6,525,952 B2 | 2/2003 | Araki et al. | |
| 6,532,556 B1 | 3/2003 | Wong et al. | |
| 6,538,922 B1 | 3/2003 | Khalid et al. | |
| 6,558,967 B1 | 5/2003 | Wong | |
| 6,560,152 B1 | 5/2003 | Cernea | |
| 6,577,539 B2 | 6/2003 | Iwahashi | |
| 6,584,012 B2 | 6/2003 | Banks | |
| 6,615,307 B1 | 9/2003 | Roohparvar | |
| 6,621,739 B2 | 9/2003 | Gonzalez et al. | |
| 6,643,169 B2 | 11/2003 | Rudelic et al. | |
| 6,646,913 B2 | 11/2003 | Micheloni et al. | |
| 6,678,192 B2 | 1/2004 | Gongwer et al. | |
| 6,687,155 B2 | 2/2004 | Nagasue | |
| 6,707,748 B2 | 3/2004 | Lin et al. | |
| 6,708,257 B2 | 3/2004 | Bao | |
| 6,714,449 B2 | 3/2004 | Khalid | |
| 6,717,847 B2 | 4/2004 | Chen | |
| 6,731,557 B2 | 5/2004 | Beretta | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,774,808 B1 | 8/2004 | Hibbs et al. | |
| 6,781,877 B2 | 8/2004 | Cernea et al. | |
| 6,807,095 B2 | 10/2004 | Chen et al. | |
| 6,809,964 B2 | 10/2004 | Moschopoulos et al. | |
| 6,829,167 B2 | 12/2004 | Tu et al. | |
| 6,845,052 B1 | 1/2005 | Ho et al. | |
| 6,851,018 B2 | 2/2005 | Wyatt et al. | |
| 6,856,546 B2 | 2/2005 | Guterman et al. | |
| 6,862,218 B2 | 3/2005 | Guterman et al. | |
| 6,870,767 B2 | 3/2005 | Rudelic et al. | |
| 6,894,926 B2 | 5/2005 | Guterman et al. | |
| 6,907,497 B2 | 6/2005 | Hosono et al. | |
| 6,930,925 B2 | 8/2005 | Guo et al. | |
| 6,934,188 B2 | 8/2005 | Roohparvar | |
| 6,937,511 B2 | 8/2005 | Hsu et al. | |
| 6,963,505 B2 | 11/2005 | Cohen | |
| 6,972,993 B2 | 12/2005 | Conley et al. | |
| 6,988,175 B2 | 1/2006 | Lasser | |
| 6,992,932 B2 | 1/2006 | Cohen | |
| 7,002,843 B2 | 2/2006 | Guterman et al. | |
| 7,012,835 B2 | 3/2006 | Gonzalez et al. | |
| 7,020,017 B2 | 3/2006 | Chen et al. | |
| 7,023,735 B2 | 4/2006 | Ban et al. | |
| 7,031,210 B2 | 4/2006 | Park et al. | |
| 7,031,214 B2 | 4/2006 | Tran | |
| 7,031,216 B2 | 4/2006 | You | |
| 7,039,846 B2 | 5/2006 | Hewitt et al. | |
| 7,042,766 B1 | 5/2006 | Wang et al. | |
| 7,054,193 B1 | 5/2006 | Wong | |
| 7,054,199 B2 | 5/2006 | Lee et al. | |
| 7,057,958 B2 | 6/2006 | So et al. | |
| 7,065,147 B2 | 6/2006 | Ophir et al. | |
| 7,068,539 B2 | 6/2006 | Guterman et al. | |

| Patent | Date | Inventor |
|---|---|---|
| 7,071,849 B2 | 7/2006 | Zhang |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,151,692 B2 | 12/2006 | Wu |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzales et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,928 B2 | 3/2007 | Chen |
| 7,197,594 B2 | 3/2007 | Raz et al. |
| 7,200,062 B2 | 4/2007 | Kinsely et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,257,027 B2 | 8/2007 | Park |
| 7,259,987 B2 | 8/2007 | Chen et al. |
| 7,266,026 B2 | 9/2007 | Gongwer et al. |
| 7,274,611 B2 | 9/2007 | Roohparvar |
| 7,277,355 B2 | 10/2007 | Tanzana |
| 7,280,398 B1 | 10/2007 | Lee et al. |
| 7,280,409 B2 | 10/2007 | Misumi et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,272 B1 | 12/2007 | Mokhlesi et al. |
| 7,310,347 B2 | 12/2007 | Lasser |
| 7,321,509 B2 | 1/2008 | Chen et al. |
| 7,342,831 B2 | 3/2008 | Mokhlesi et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,388,781 B2 | 6/2008 | Litsyn et al. |
| 7,397,697 B2 | 7/2008 | So et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,420,847 B2 | 9/2008 | Li |
| 7,433,231 B2 | 10/2008 | Aritome |
| 7,437,498 B2 | 10/2008 | Ronen |
| 7,440,324 B2 | 10/2008 | Mokhlesi |
| 7,441,067 B2 | 10/2008 | Gorobetz et al. |
| 7,453,737 B2 | 11/2008 | Ha |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,471,581 B2 | 12/2008 | Tran et al. |
| 7,492,641 B2 | 2/2009 | Hosono et al. |
| 7,508,710 B2 | 3/2009 | Mokhlesi |
| 7,539,062 B2 | 5/2009 | Doyle |
| 7,551,492 B2 | 6/2009 | Kim |
| 7,568,135 B2 | 7/2009 | Cornwell et al. |
| 7,570,520 B2 | 8/2009 | Kamei et al. |
| 7,593,259 B2 | 9/2009 | Kim et al. |
| 7,596,707 B1 | 9/2009 | Vemula |
| 7,631,245 B2 | 12/2009 | Lasser |
| 7,633,798 B2 | 12/2009 | Sarin et al. |
| 7,633,802 B2 | 12/2009 | Mokhlesi |
| 7,656,734 B2 | 2/2010 | Thorp et al. |
| 7,660,158 B2 | 2/2010 | Aritome |
| 7,660,183 B2 | 2/2010 | Ware et al. |
| 7,742,351 B2 | 6/2010 | Inoue et al. |
| 7,761,624 B2 | 7/2010 | Karamcheti et al. |
| 7,810,017 B2 | 10/2010 | Radke |
| 7,848,149 B2 | 12/2010 | Gonzalez et al. |
| 7,885,119 B2 | 2/2011 | Li |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0118574 A1 | 8/2002 | Gongwer et al. |
| 2002/0133684 A1 | 9/2002 | Anderson |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Tran |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0086574 A1 | 4/2005 | Fackenthal |
| 2005/0121436 A1 | 6/2005 | Kamitani et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1 | 10/2006 | Hemink et al. |
| 2006/0221714 A1* | 10/2006 | Li et al. .......... 365/189.01 |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1 | 4/2007 | Lasser et al. |
| 2007/0091694 A1 | 4/2007 | Lee et al. |

| | | |
|---|---|---|
| 2007/0103978 A1 | 5/2007 | Conley et al. |
| 2007/0103986 A1 | 5/2007 | Chen |
| 2007/0109845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0270730 A1 | 10/2008 | Lasser et al. |
| 2008/0282106 A1 | 11/2008 | Shalvi et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0172257 A1 | 7/2009 | Prins et al. |
| 2009/0172261 A1 | 7/2009 | Prins et al. |
| 2009/0204824 A1 | 8/2009 | Lin et al. |
| 2009/0204872 A1 | 8/2009 | Yu et al. |
| 2009/0225595 A1 | 9/2009 | Kim |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169743 A1 | 7/2010 | Vogan et al. |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |

OTHER PUBLICATIONS

Takeuchi et al., "A Multipage Cell Architecture for High-Speed Programming Multilevel NAND Flash Memories", IEEE Journal of Solid State Circuits, vol. 33, No. 8, Aug. 1998.
Jedec Standard JESD84-C44, "Embedded MultiMediaCard (e•MMC) Mechanical Standard, with Optional Reset Signal", Jedec Solid State Technology Association, USA, Jul. 2009.
Jedec, "UFS Specification", version 0.1, Nov. 11, 2009.
SD Group and SD Card Association, "SD Specifications Part 1 Physical Layer Specification", version 3.01, draft 1.00, Nov. 9, 2009.
Compaq et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word- Line Voltage Pulses", IEEE Electron Device Letters, vol. 18, No. 10, pp. 503-505, Oct. 1997.

Agrell et al., "Closest Point Search in Lattices", IEEE Transactions on Information Theory, vol. 48, No. 8, pp. 2201-2214, Aug. 2002.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Engh et al., "A self adaptive programming method with 5 mV accuracy for multi-level storage in FLASH", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, p. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Kawaguchi et al. 1995. A flash-memory based file system. In Proceedings of the USENIX 1995 Technical Conference, New Orleans, Louisiana. 155-164.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul. 3, 2008.

International Application PCT/IL2007/000580 Patentability Report dated Mar. 10, 2009.

International Application PCT/IL2007/000580 Search Report dated Sep. 11, 2008.

International Application PCT/IL2007/000581 Patentability Report dated Mar. 26, 2009.

International Application PCT/IL2007/000581 Search Report dated Aug. 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug. 7, 2008.

International Application PCT/IL2007/001315 Patentability Report dated May 5, 2009.

International Application PCT/IL2007/001316 Search report dated Jul. 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov. 25, 2008.

International Application PCT/IL2008/000519 Search report dated Nov. 20, 2008.

International Application PCT/IL2008/001188 Search Report dated Jan. 28, 2009.

International Application PCT/IL2008/001356 Search Report dated Feb. 3, 2009.

International Application PCT/IL2008/001446 Search report dated Feb. 20, 2009.

International Application PCT/IL2008/001446 "Optimized selection of memory chips in multi-chip memory devices" filed on Nov. 4, 2008.

Shalvi et al., U.S. Appl. No. 12/251,471 "Compensation for Voltage Drifts in Analog Memory Cells" filed Oct. 15, 2008.

Kasorla et al, U.S. Appl. No. 12/332,370 "Efficient Data Storage in Multi-Plane Memory Devices" filed Dec. 11, 2008.

Sommer, N., U.S. Appl. No. 12/364,531 "Parameter Estimation Based on Error Correction Code Parity Check Equations" filed Feb. 3, 2009.

Golov et al., U.S. Appl. No. 12/344,233 "Wear Level Estimation in Analog Memory Cells" filed Dec. 25, 2008.

Perlmutter et al., U.S. Appl. No. 12/388,528 "Programming of Analog Memory Cells Using a Single Programming Pulse per State Transition" filed Feb. 19, 2009.

Perlmutter et al., U.S. Appl. No. 12/390,522 "Programming Analog Memory Cells for Reduced Variance After Retention" filed Feb. 23, 2009.

Perlmutter et al., U.S. Appl. No. 12/405,275 "Memory Device with Multiple-Accuracy Read Commands" filed Mar. 17, 2009.

Perlmutter et al., U.S. Appl. No. 12/397,368 "Efficient Readout from Analog Memory Cells Using Data Compression" filed Mar. 4, 2009.

Sommer, N., U.S. Appl. No. 12/171,797 "Memory Device with Non-Uniform Programming Levels" filed Jul. 11, 2008.

Perlmutter et al, U.S. Appl. No. 12/332,368 "Efficient Interference Cancellation in Analog Memory Cell Arrays" filed Dec. 11, 2008.

Huffman, A., "Non-Volatile Memory Host Controller Interface (NVMHCI)", Specification 1.0, Apr. 14, 2008.

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

U.S. Appl. No. 11/957,970 Official Action dated May 20, 2010.

Shalvi et al., U.S. Appl. No. 12/822,207 "Adaptive Over-Provisioning in Memory Systems" filed Jun. 24, 2010.

Bez et al., "Introduction to Flash Memory," Proceedings of the IEEE, vol. 91, No. 4, Apr. 2003, pp. 489-502.

Eitan et al., "Multilevel Flash Cells and their Trade-Offs," Proceedings of the 1996 IEEE International Electron Devices Meeting (IEDM)5 New York, New York, pp. 169-172.

Eitan et al., "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pp. 522-524.

Maayan et al., "A 512Mb NROM Flash Data Storage Memory with 8MB/s Data Rate," Proceedings of the 2002 IEEE International Solid-State Circuits Conference (ISSCC 2002), San Fransisco, California, Feb. 3-7, 2002, pp. 100-101.

Kim and Koh, "Future Memory Technology including Emerging New Memories," Proceddings of the 24 International Conference on Microelectronics (MIEL 2004), Nis, Serbia, and Montenegro, May 16-19, 2004, vol. 1, pp. 377-384.

U.S. Appl. No. 60/747,106 (May 12, 2006).

U.S. Appl. No. 60/867,399 (Nov. 28, 2006).

U.S. Appl. No. 60/886,429 (Jan. 24, 2007).

Jung et al., "A 117-mm2 3.3-V Only 128-Mb Multilevel NANAD Flash Memory for Mass Storage Applications," IEEE Journal of Solid State Circuits, vol. 31, No. 11, Nov. 1996, pp. 1575-1583.

Takeuchi et al., "A Multipage Cell Architecture for High-Speed Programming Multilevel NAND Flash Memories," IEEE Journal of Solid-State Circuits, vol. 33, No. 8, Aug. 1998, pp. 1228-1238.

Lee et al., "Effects of Floating-Gate Interference on NAND Flash Memory Cell Operation," IEEE Electron Device Letters, vol. 23, No. 5, May 2002, pp. 264-266.

U.S. Appl. No. 60/806,533 (Jan. 4, 2006).

U.S. Appl. No. 60/827,067 (Sep. 27, 2006).

U.S. Appl. No. 60/885,024 (Jan. 16, 2007).

U.S. Appl. No. 11/949,135 Official Action dated Oct. 2, 2009.

U.S. Appl. No. 11/995,814 Official Action dated Dec. 17, 2010.

U.S. Appl. No. 12/388,528 Official Action dated Nov. 29, 2010.

U.S. Appl. No. 12/251,471 Official Action dated Jan. 3, 2011.

Engineering Windows 7, "Support and Q&A for Solid-State Drives", e7blog, May 5, 2009.

Micron Technology Inc., "Memory Management in NAND Flash Arrays", Technical Note, year 2005.

Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.

Park et al., "Sub-Grouped Superblock Management for High-Performance Flash Storages", IEICE Electronics Express, vol. 6, No. 6, pp. 297-303, Mar. 25, 2009.

"How to Resolve "Bad Super Block: Magic Number Wrong" in BSD", Free Online Articles Director Article Base, posted Sep. 5, 2009.

UBUNTU Forums, "Memory Stick Failed 10 Superblock", posted Nov. 11, 2009.

Super User Forums, "SD Card Failure, can't read superblock", posted Aug. 8, 2010.

U.S. Appl. No. 12/987,174, filed Jan. 10, 2011.

U.S. Appl. No. 12/987,175, filed Jan. 10, 2011.

U.S. Appl. No. 12/963,649, filed Dec. 9, 2010.

U.S. Appl. No. 13/021,754, filed Feb. 6, 2011.

U.S. Appl. No. 12/534,898 Official Action dated Mar. 23, 2011.

U.S. Appl. No. 13/047,822, filed Mar. 15, 2011.

U.S. Appl. No. 13/069,406, filed Mar. 23, 2011.

U.S. Appl. No. 13/088,361, filed Apr. 17, 2011.

Ankolekar et al., "Multibit Error-Correction Methods for Latency-Constrained Flash Memory Systems", IEEE Transactions on Device and Materials Reliability, vol. 10, No. 1, pp. 33-39, Mar. 2010.

U.S. Appl. No. 12/344,233 Official Action dated Jun. 24, 2011.

U.S. Appl. No. 11/995,813 Official Action dated Jun. 16, 2011.

Berman et al., "Mitigating Inter-Cell Coupling Effects in MLC NAND Flash via Constrained Coding", Flash Memory Summit, Santa Clara, USA, Aug. 19, 2010.

U.S. Appl. No. 12/178,318 Official Action dated May 31, 2011.

CN Patent Application # 200780026181.3 Official Action dated Apr. 8, 2011.

U.S. Appl. No. 12/880,101 "Reuse of Host Hibernation Storage Space by Memory Controller", filed Sep. 12, 2010.

U.S. Appl. No. 12/890,724 "Error Correction Coding Over Multiple Memory Pages", filed Sep. 27, 2010.

U.S. Appl. No. 12/171,797 Official Action dated Aug. 25, 2010.

U.S. Appl. No. 12/497,707 Official Action dated Sep. 15, 2010.

Numonyx, "M25PE16: 16-Mbit, page-erasable serial flash memory with byte-alterability, 75 MHz SPI bus, standard pinout", Apr. 2008.

Hong et al., "NAND Flash-based Disk Cache Using SLC/MLC Combined Flash Memory", 2010 International Workshop on Storage Network Architecture and Parallel I/Os, pp. 21-30, USA, May 3, 2010.

U.S. Appl. No. 11/945,575 Official Action dated Aug. 24, 2010.

U.S. Appl. No. 12/045,520 Official Action dated Nov. 16, 2010.

Wei, L., "Trellis-Coded Modulation With Multidimensional Constellations", IEEE Transactions on Information Theory, vol. IT-33, No. 4, pp. 483-501, Jul. 1987.

U.S. Appl. No. 13/114,049 Official Action dated Sep. 12, 2011.

U.S. Appl. No. 12/405,275 Official Action dated Jul. 29, 2011.

US 7,161,836, 01/2007, Wan et al. (withdrawn)

* cited by examiner

DISTORTION ESTIMATION AND CANCELLATION IN MEMORY DEVICES

CROSS-REFERENCE TO RELATED APPLICATIONS

This application is the U.S. national phase of PCT Application No. PCT/IL2007/000576, filed May 10, 2007, and published in English on Nov. 22, 2007, which claims the benefit of U.S. Provisional Patent Application 60/747,106, filed May 12, 2006, U.S. Provisional Patent Application 60/867,399, filed Nov. 28, 2006, U.S. Provisional Patent Application 60/806,533, filed Jul. 4, 2006, U.S. Provisional Patent Application 60/827,067, filed Sep. 27, 2006, U.S. Provisional Patent Application 60/885,024, filed Jan. 16, 2007, and U.S. Provisional Patent Application 60/886,429, filed Jan. 24, 2007, whose disclosures are incorporated herein by reference.

FIELD OF THE INVENTION

The present invention relates generally to memory devices, and particularly to methods and systems for estimating and compensating for distortion in memory devices.

BACKGROUND OF THE INVENTION

Several types of memory devices, such as Flash memories and Dynamic Random Access Memory (DRAM), use arrays of analog memory cells for storing data. Flash memory devices are described, for example, by Bez et al., in "Introduction to Flash Memory," Proceedings of the IEEE, volume 91, number 4, April, 2003, pages 489-502, which is incorporated herein by reference.

In such memory devices, each analog memory cell typically comprises a transistor, which holds a certain amount of electric charge that represents the information stored in the cell. The electric charge written into a particular cell influences the "threshold voltage" of the cell, i.e., the voltage that needs to be applied to the cell so that the cell will conduct a certain amount of current.

Some memory devices, commonly referred to as Single-Level Cell (SLC) devices, store a single bit of information in each memory cell. Typically, the range of possible threshold voltages of the cell is divided into two regions. A voltage value falling in one of the regions represents a "0" bit value, and a voltage belonging to the second region represents "1". Higher-density devices, often referred to as Multi-Level Cell (MLC) devices, store two or more bits per memory cell. In multi-level cells, the range of threshold voltages is divided into more than two regions, with each region representing more than one bit.

Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference.

Other exemplary types of analog memory cells are Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

The threshold voltage values read from analog memory cells are sometimes distorted. The distortion is due to various reasons, such as electrical field coupling from neighboring memory cells, disturb noise caused by memory access operations on other cells in the array and threshold voltage drift caused by device aging. Some common distortion mechanisms are described in the article by Bez et al., cited above. Distortion effects are also described by Lee et al., in "Effects of Floating Gate Interference on NAND Flash Memory Cell Operation," IEEE Electron Device Letters, (23:5), May, 2002, pages 264-266, which is incorporated herein by reference.

U.S. Pat. No. 5,867,429, whose disclosure is incorporated herein by reference, describes a method for compensating for electric field coupling between floating gates of a high density Flash Electrically Erasable Programmable Read Only Memory (EEPROM) cell array. According to the disclosed method, a reading of a cell is compensated by first reading the states of all cells that are field-coupled with the cell being read. A number related to either the floating gate voltage or the state of each coupled cell is then multiplied by the coupling ratio between the cells. The breakpoint levels between states for each of the cells are adjusted by an amount that compensates for the voltage coupled from adjacent cells.

SUMMARY OF THE INVENTION

Embodiments of the present invention provide a method for operating a memory, including:

storing data in a group of analog memory cells of the memory as respective first voltage levels, selected from a set of possible values;

after storing the data, reading from the analog memory cells respective second voltage levels, which are affected by cross-coupling interference causing the second voltage levels to differ from the respective first voltage levels;

processing the second voltage levels to derive respective hard decisions, each corresponding to a respective value among the possible values of the first voltage levels;

estimating cross-coupling coefficients, which quantify the cross-coupling interference among the analog memory cells, based on the second voltage levels and the respective hard decisions; and reconstructing the data stored in the group of analog memory cells from the read second voltage levels using the estimated cross-coupling coefficients.

In some embodiments, estimating the cross-coupling coefficients includes processing the second voltage levels and the respective hard decisions using a block estimation process. Alternatively, estimating the cross-coupling coefficients includes sequentially scanning the second voltage levels and the respective hard decisions using a sequential estimation process that converges to the cross-coupling coefficients.

Estimating the cross-coupling coefficients may include applying an estimation process that reduces a distance metric between the read second voltage levels and the respective hard decisions.

In an embodiment, the method includes evaluating the cross-coupling interference caused by a first analog memory cell to a second analog memory cell in the memory based on both the second voltage level read from the first analog memory cell and on the second voltage level read from the second analog memory cell.

In another embodiment, reconstructing the data includes removing the cross-coupling interference from the second voltage levels using one of a linear equalization process, a Decision-Feedback Equalization (DFE) process, a Maximum a Posteriori (MAP) estimation process and a Maximum-Likelihood Sequence Estimation (MLSE) process. In yet another embodiment, estimating the cross-coupling coefficients and reconstructing the data include estimating the cross-coupling coefficients in a first processing stage, and canceling the estimated cross-coupling interference in a second processing stage subsequent to the first processing stage. In still another embodiment, estimating the cross-coupling coefficients and reconstructing the data include using the estimated cross-coupling coefficients for subsequent instances of the second processing stage, and repeating the first processing stage only upon failure to reconstruct the data.

In a disclosed embodiment, storing the data includes encoding the data using an Error Correcting Code (ECC), reconstructing the data includes computing error correction metrics based on the estimated cross-coupling coefficients and decoding the ECC using the error correction metrics.

There is additionally provided, in accordance with an embodiment of the present invention, a method for operating a memory, including:

storing data as respective first voltage levels in analog memory cells of the memory, in which a subset of the memory cells has correlative distortion;

after storing the data, reading from one or more of the analog memory cells in the subset respective second voltage levels, which differ from the first voltage levels due to the correlative distortion;

processing the second voltage levels read from the one or more of the analog memory cells in order to estimate respective distortion levels in the second voltage levels;

reading a second voltage level from another analog memory cell in the subset;

predicting a distortion level in the second voltage level read from the other analog memory cell based on the estimated respective distortion levels of the one or more of the analog memory cells in the subset;

correcting the second voltage level read from the other memory cell using the predicted distortion level; and reconstructing the data stored in the other memory cell based on the corrected second voltage level.

In some embodiments, the subset of the memory cells includes at least one subset type selected from a group of subset types consisting of memory cells located on a common bit line, memory cells located on a common word line, memory cells having common circuitry and memory cells located in proximity to one another.

In an embodiment, processing the second voltage levels includes caching only a single value indicative of the distortion levels in the second voltage levels read from the one or more of the analog memory cells in the subset, and predicting the distortion level includes calculating the predicted distortion level based on the cached single value. In another embodiment, predicting the distortion includes tracking distortion parameters common to the subset of the memory cells and storing the distortion parameters in a data structure.

There is also provided, in accordance with an embodiment of the present invention, a method for operating a memory, including:

storing data as respective first voltage levels in a group of analog memory cells of the memory;

performing a memory access operation on a first analog memory cell in the memory;

responsively to performing the memory access operation, reading a second voltage level from a second analog memory cell in the memory;

processing the second voltage level so as to estimate a level of disturbance in the second voltage level that was caused by performing the memory access operation on the first analog memory cell;

correcting the second voltage level using the estimated level of the disturbance; and reconstructing the data stored in the second analog memory cell based on the corrected second voltage level.

In some embodiments, the memory access operation includes at least one operation selected from a group of operations consisting of a programming operation, a reading operation and an erasure operation. Processing and correcting the second voltage level may include comparing the estimated level of the disturbance to a predefined level, and correcting the second voltage level only when the estimated level of the disturbance exceeds the predefined level. In an embodiment, correcting the second voltage level includes re-programming the data stored in the second analog memory cell. In another embodiment, correcting the second voltage level includes copying the data stored in the second analog memory cell to another analog memory cell different from the second analog memory cell. Alternatively, correcting the second voltage level may include increasing a first voltage level used for storing the data in the second memory cell. Processing the second voltage level may be performed during idle periods when not storing and reading the data.

In a disclosed embodiment, reading the second voltage level includes reading multiple second voltage levels from respective multiple second memory cells, and processing the second voltage levels includes assessing a number of the second memory cells that transitioned from an erased level to a programmed level due to the memory access operation. In another embodiment, storing the data includes storing the data in sequential order in multiple groups of the analog memory cells, reading the second voltage level includes reading the groups of the memory cells in reverse order, and processing the second voltage level includes estimating the level of the disturbance caused to the first memory cell responsively to the second voltages of the memory cells in the groups that were read before the first memory cell.

There is further provided, in accordance with an embodiment of the present invention, a method for operating a memory, including:

storing data as respective first voltage levels in a group of analog memory cells of the memory;

after storing the data, reading from the analog memory cells respective second voltage levels, at least some of which differ from the respective first voltage levels;

identifying a subset of the analog memory cells that potentially cause distortions to a second voltage level read from a target analog memory cell;

classifying the analog memory cells in the subset into multiple classes based on a relation between respective times at which the data was stored in the analog memory cells and a time at which the data was stored in the target analog memory cell;

estimating, for each of the classes, a respective distortion caused to the second voltage level in the target memory cell by the analog memory cells in the class;

correcting the second voltage level read from the target analog memory cell using the estimated respective distortion for each of one or more of the classes; and reconstructing the data stored in the target analog memory cell based on the corrected second voltage level.

In some embodiments, storing the data and reading the second voltage levels include applying a Program and Verify (P&V) process. In an embodiment, classifying the analog memory cells includes identifying the analog memory cells in the subset in which the data was stored more recently than in the target analog memory cell, and correcting the second voltage level includes correcting the second voltage level read from the target analog memory cell based on the distortion in only the identified analog memory cells. In an alternative embodiment, classifying the analog memory cells includes defining a first class including the analog memory cells in the subset in which the data was stored more recently than in the target analog memory cell, a second class including the analog memory cells in the subset in which the data was stored earlier than in the target analog memory cell, and a third class including the analog memory cells in the subset in which the data was stored concurrently with storing the data in the target analog memory cell.

In another embodiment, reading the second voltage levels, estimating the distortion and correcting the second voltage level include processing the second voltage level read from the target analog memory cell with a first resolution and processing the second voltage levels read from the analog memory cells in the subset with a second resolution coarser than the first resolution. In yet another embodiment, storing the data includes storing indications of the times at which the data was stored in the analog memory cells, and classifying the analog memory cells includes querying the stored indications. In still another embodiment, estimating the distortion includes estimating a level of the distortion responsively to at least one parameter selected from a group of parameters consisting of programming times of the analog memory cells, the data stored in the analog memory cells, a location of the analog memory cells with respect to the target memory cell and a number of recent programming-erasure cycles the target memory cell has gone through.

There is additionally provided, in accordance with an embodiment of the present invention, a method for operating a memory, including:

accepting data for storage in the memory;

determining respective first voltage levels for programming a group of analog memory cells of the memory so as to cause the analog memory cells to store respective values of a physical quantity that represent the data;

programming the analog memory cells in the group using the determined first voltage levels;

after programming the analog memory cells, reading second voltage levels from the respective analog memory cells and reconstructing the data from the second voltage levels.

In some embodiments, determining the first voltage levels includes estimating distortion caused to a value of the physical quantity stored in a target analog memory cell by the values of the physical quantities stored in one or more other analog memory cells when storing the data in the target analog memory cell, and pre-correcting a first voltage level used for programming the target analog memory cell responsively to the estimated distortion. In another embodiment, reconstructing the data includes estimating distortion caused to a value of the physical quantity stored in a target analog memory cell by the values of the physical quantities stored in one or more other analog memory cells when reading the second voltage levels based on the read second voltage levels, correcting a second voltage level read from the target analog memory cell using the estimated distortion, and reconstructing the data stored in the target analog memory cell based on the corrected second voltage level.

Programming the analog memory cells may include verifying the programmed first voltage levels. In some embodiments, the physical quantity includes an electrical charge.

There is also provided, in accordance with an embodiment of the present invention, a method for operating a memory, including:

storing data as respective first voltage levels in a group of analog memory cells of the memory;

after storing the data, reading from the analog memory cells in the group second voltage levels, at least some of which differ from the respective first voltage levels;

estimating a distortion level in the second voltage levels read from the analog memory cells; and when the estimated distortion level violates a predetermined distortion criterion, re-programming the data into the analog memory cells of the memory.

In some embodiments, the predetermined distortion criterion includes a threshold defining a maximum tolerable distortion level.

There is also provided, in accordance with an embodiment of the present invention, a method for operating a memory, including:

storing data as respective first voltage levels in a group of analog memory cells of the memory;

after storing the data, reading from the analog memory cells respective second voltage levels, at least some of which differ from the respective first voltage levels;

identifying a subset of the analog memory cells that potentially cause distortions to a second voltage level read from a target analog memory cell;

estimating a difference between a first distortion level caused by the memory cells in the subset to the target memory cell at a first time instant in which the target memory cell was programmed and a second distortion level caused by the memory cells in the subset to the target memory cell at a second time instant in which the target memory cell was read; and correcting the second voltage level read from the target memory cell using the estimated difference.

There is additionally provided, in accordance with an embodiment of the present invention, a method for operating a memory, including:

storing data in a group of analog memory cells of the memory as respective first voltage levels;

after storing the data, reading from the analog memory cells respective second voltage levels, which are affected by cross-coupling interference causing the second voltage levels to differ from the respective first voltage levels;

estimating cross-coupling coefficients, which quantify the cross-coupling interference among the analog memory cells by processing the second voltage levels; and reconstructing the data stored in the group of analog memory cells from the read second voltage levels using the estimated cross-coupling coefficients.

In some embodiments, the cross-coupling interference caused by a first analog memory cell to a second analog memory cell in the memory is evaluated based on both the second voltage level read from the first analog memory cell and on the second voltage level read from the second analog memory cell.

There is further provided, in accordance with an embodiment of the present invention, a data storage apparatus, including:

an interface, which is operative to communicate with a memory that includes a plurality of analog memory cells; and a memory signal processor (MSP), which is coupled to the interface and is arranged to store data in a group of the analog memory cells as respective first voltage levels selected from a set of possible values, to read from the analog memory cells, after storing the data, respective second voltage levels, which are affected by cross-coupling interference causing the second voltage levels to differ from the respective first voltage levels, to process the second voltage levels to derive respective hard decisions, each corresponding to a respective value among the possible values of the first voltage levels, to estimate cross-coupling coefficients, which quantify the cross-coupling interference among the analog memory cells, based on the second voltage levels and the respective hard decisions, and to reconstruct the data stored in the group of analog memory cells from the second voltage levels using the estimated cross-coupling coefficients.

There is also provided, in accordance with an embodiment of the present invention, a data storage apparatus, including:

an interface, which is operative to communicate with a memory that includes multiple analog memory cells, of which a subset of the memory cells has correlative distortion; and a memory signal processor (MSP), which is coupled to the interface and is arranged to store data as respective first voltage levels in the analog memory cells, to read from one or more of the analog memory cells in the subset, after storing the data, respective second voltage levels, which differ from the first voltage levels due to the correlative distortion, to process the second voltage levels read from the one or more of the analog memory cells in order to estimate respective distortion levels in the second voltage levels, to read a second voltage level from another analog memory cell in the subset, to predict a distortion level in the second voltage level read from the other analog memory cell based on the estimated respective distortion levels of the one or more of the analog memory cells in the subset, to correct the second voltage level read from the other memory cell using the predicted distortion level, and to reconstruct the data stored in the other memory cell based on the corrected second voltage level.

There is additionally provided, in accordance with an embodiment of the present invention, a data storage apparatus, including:

an interface, which is operative to communicate with a memory that includes a plurality of analog memory cells; and a memory signal processor (MSP), which is coupled to the interface and is arranged to store data as respective first voltage levels in a group of the analog memory cells, to perform a memory access operation on a first analog memory cell in the memory, to read, responsively to performing the memory access operation, a second voltage level from a second analog memory cell in the memory, to process the second voltage level so as to estimate a level of disturbance in the second voltage level that was caused by performing the memory access operation on the first analog memory cell, to correct the second voltage level using the estimated level of the disturbance, and to reconstruct the data stored in the second analog memory cell based on the corrected second voltage level.

There is also provided, in accordance with an embodiment of the present invention, a data storage apparatus, including:

an interface, which is operative to communicate with a memory that includes a plurality of analog memory cells; and a memory signal processor (MSP), which is coupled to the interface and is arranged to store data as respective first voltage levels in a group of the analog memory cells, to read from the analog memory cells, after storing the data, respective second voltage levels, at least some of which differ from the respective first voltage levels, to identify a subset of the analog memory cells that potentially cause distortions to a second voltage level read from a target analog memory cell, to classify the analog memory cells in the subset into multiple classes based on a relation between respective times at which the data was stored in the analog memory cells and a time at which the data was stored in the target analog memory cell, to estimate, for each of the classes, a respective distortion caused to the second voltage level in the target memory cell by the analog memory cells in the class, to correct the second voltage level read from the target analog memory cell using the estimated respective distortion for each of one or more of the classes, and to reconstruct the data stored in the target analog memory cell based on the corrected second voltage level.

There is also provided, in accordance with an embodiment of the present invention, a data storage apparatus, including:

an interface, which is operative to communicate with a memory that includes a plurality of analog memory cells; and a memory signal processor (MSP), which is coupled to the interface and is arranged to accept data for storage in the memory, to determine respective first voltage levels for programming a group of the analog memory cells so as to cause the analog memory cells to store respective values of a physical quantity that represent the data, to program the analog memory cells in the group using the first voltage levels, to read, after programming the analog memory cells, second voltage levels from the respective analog memory cells, and to reconstruct the data from the second voltage levels.

There is also provided, in accordance with an embodiment of the present invention, a data storage apparatus, including:

an interface, which is operative to communicate with a memory that includes a plurality of analog memory cells; and a memory signal processor (MSP), which is coupled to the interface and is arranged to store data as respective first voltage levels in a group of the analog memory cells, to read from the analog memory cells in the group, after storing the data, second voltage levels, at least some of which differ from the respective first voltage levels, to estimate a distortion level in the second voltage levels read from the analog memory cells, and, when the estimated distortion level violates a predetermined distortion criterion, to reprogram the data into the analog memory cells in the group.

There is additionally provided, in accordance with an embodiment of the present invention, a data storage apparatus, including:

an interface, which is operative to communicate with a memory that includes a plurality of analog memory cells; and a memory signal processor (MSP), which is coupled to the interface and is arranged to store data as respective first voltage levels in a group of the analog memory cells of the memory, to read from the analog memory cells, after storing the data, respective second voltage levels, at least some of which differ from the respective first voltage levels, to identify a subset of the analog memory cells that potentially cause distortions to a second voltage level read from a target analog memory cell, to estimate a difference between a first distortion level caused by the memory cells in the subset to the target memory cell at a first time instant in which the target memory cell was programmed and a second distortion level caused by the memory cells in the subset to the target memory cell at a second time instant in which the target memory cell was read, and to correct the second voltage level read from the target memory cell using the estimated difference.

There is also provided, in accordance with an embodiment of the present invention, a data storage apparatus, including:

an interface, which is operative to communicate with a memory that includes a plurality of analog memory cells; and a memory signal processor (MSP), which is coupled to the interface and is arranged to store data in a group of the analog memory cells of the memory as respective first voltage levels, to read from the analog memory cells, after storing the data, respective second voltage levels, which are affected by cross-coupling interference causing the second voltage levels to differ from the respective first voltage levels, to estimate cross-coupling coefficients, which quantify the cross-coupling interference among the analog memory cells by processing the second voltage levels, and to reconstruct the data stored in the group of analog memory cells from the read second voltage levels using the estimated cross-coupling coefficients.

There is additionally provided, in accordance with an embodiment of the present invention, a data storage apparatus, including:

a memory, which includes a plurality of analog memory cells; and a memory signal processor (MSP), which is coupled to the memory and is arranged to store data in a group of the analog memory cells as respective first voltage levels selected from a set of possible values, to read from the analog memory cells, after storing the data, respective second voltage levels, which are affected by cross-coupling interference causing the second voltage levels to differ from the respective first voltage levels, to process the second voltage levels to derive respective hard decisions, each corresponding to a respective value among the possible values of the first voltage levels, to estimate cross-coupling coefficients, which quantify the cross-coupling interference among the analog memory cells, based on the second voltage levels and the respective hard decisions, and to reconstruct the data stored in the group of analog memory cells from the second voltage levels using the cross-coupling coefficients.

There is additionally provided, in accordance with an embodiment of the present invention, a data storage apparatus, including:

a memory, which includes multiple analog memory cells, of which a subset of the memory cells has correlative distortion; and a memory signal processor (MSP), which is coupled to the memory and is arranged to store data as respective first voltage levels in a group of the analog memory cells, to read from one or more of the analog memory cells in a column of the array, after storing the data, respective second voltage levels, which differ from the first voltage levels due to a distortion, to process the second voltage levels read from the one or more of the analog memory cells in order to estimate respective distortion levels in the second voltage levels, to read a second voltage level from another analog memory cell in the column, to predict a distortion level in the second voltage level read from the other analog memory cell based on the estimated respective distortion levels of the one or more of the analog memory cells in the column, to correct the second voltage level read from the other memory cell using the predicted distortion level, and to reconstruct the data stored in the other memory cell based on the corrected second voltage level.

There is additionally provided, in accordance with an embodiment of the present invention, a data storage apparatus, including:

a memory, which includes a plurality of analog memory cells; and a memory signal processor (MSP), which is coupled to the memory and is arranged to store data as respective first voltage levels in a group of the analog memory cells, to perform a memory access operation on a first analog memory cell in the memory, to read, responsively to performing the memory access operation, a second voltage level from a second analog memory cell in the memory, to process the second voltage level so as to estimate a level of disturbance in the second voltage level that was caused by performing the memory access operation on the first analog memory cell, to correct the second voltage level using the estimated level of the disturbance, and to reconstruct the data stored in the second analog memory cell based on the corrected second voltage level.

There is additionally provided, in accordance with an embodiment of the present invention, a data storage apparatus, including:

a memory, which includes a plurality of analog memory cells; and a memory signal processor (MSP), which is coupled to the memory and is arranged to store data as respective first voltage levels in a group of the analog memory cells, to read from the analog memory cells, after storing the data, respective second voltage levels, at least some of which differ from the respective first voltage levels, to identify a subset of the analog memory cells that potentially cause distortions to a second voltage level read from a target analog memory cell, to classify the analog memory cells in the subset into multiple classes based on a relation between respective times at which the data was stored in the analog memory cells and a time at which the data was stored in the target analog memory cell, to estimate, for each of the classes, a respective distortion caused to the second voltage level in the target memory cell by the analog memory cells in the class, to correct the second voltage level read from the target analog memory cell using the estimated respective distortion for each of one or more of the classes, and to reconstruct the data stored in the target analog memory cell based on the corrected second voltage level.

There is additionally provided, in accordance with an embodiment of the present invention, a data storage apparatus, including:

a memory, which includes a plurality of analog memory cells; and a memory signal processor (MSP), which is coupled to the memory and is arranged to accept data for storage in the memory, to determine respective first voltage levels for programming a group of the analog memory cells so as to cause the analog memory cells to store respective values of a physical quantity that represent the data, to program the analog memory cells in the group using the first voltage levels, to read, after programming the analog memory cells, second voltage levels from the respective analog memory cells, and to reconstruct the data from the second voltage levels.

There is additionally provided, in accordance with an embodiment of the present invention, a data storage apparatus, including:

a memory, which includes a plurality of analog memory cells; and a memory signal processor (MSP), which is coupled to the memory and is arranged to store data as respective first voltage levels in a group of the analog memory cells, to read from the analog memory cells in the group, after storing the data, second voltage levels, at least some of which differ from the respective first voltage levels, to estimate a distortion level in the second voltage levels read from the analog memory cells, and, when the estimated distortion level violates a predetermined distortion criterion, to re-program the data into the analog memory cells in the group.

There is additionally provided, in accordance with an embodiment of the present invention, a data storage apparatus, including:

a memory, which includes a plurality of analog memory cells; and a memory signal processor (MSP), which is coupled to the memory and is arranged to store data as respective first voltage levels in a group of the analog memory cells of the memory, to read from the analog memory cells, after storing the data, respective second voltage levels, at least some of which differ from the respective first voltage levels, to identify a subset of the analog memory cells that potentially cause distortions to a second voltage level read from a target analog memory cell, to estimate a difference between a first distortion level caused by the memory cells in the subset to the target memory cell at a first time instant in which the target memory cell was programmed and a second distortion level caused by the memory cells in the subset to the target memory cell at a second time instant in which the target memory cell was read, and to correct the second voltage level read from the target memory cell using the estimated difference.

There is additionally provided, in accordance with an embodiment of the present invention, a data storage apparatus, including:

a memory, which includes a plurality of analog memory cells; and a memory signal processor (MSP), which is coupled to the memory and is arranged to store data in a group of the analog memory cells of the memory as respective first voltage levels, to read from the analog memory cells, after storing the data, respective second voltage levels, which are affected by cross-coupling interference causing the second voltage levels to differ from the respective first voltage levels, to estimate cross-coupling coefficients, which quantify the cross-coupling interference among the analog memory cells by processing the second voltage levels, and to reconstruct the data stored in the group of analog memory cells from the read second voltage levels using the estimated cross-coupling coefficients.

The present invention will be more fully understood from the following detailed description of the embodiments thereof, taken together with the drawings in which:

DETAILED DESCRIPTION OF EMBODIMENTS

Overview

Embodiments of the present invention provide methods and systems for estimating and compensating for distortion in arrays of analog memory cells. In the embodiments that are described hereinbelow, data is stored as levels of electric charge that are written into an array of analog memory cells. The charge levels determine the respective threshold voltages of the cells. A Memory Signal Processor (MSP) reads the voltage levels from the memory cells and adaptively estimates the level of distortion contained therein. The MSP typically produces corrected voltages in which the distortion is corrected, canceled or otherwise compensated for. The data stored in the memory cells is reconstructed using the corrected voltages.

Several exemplary distortion estimation and cancellation methods are described herein. Some methods are decision-directed, i.e., use the output of a hard-decision slicing process. In some cases, the distortion estimation process takes into account the time at which potentially-interfering cells were programmed, with respect to the time the interfered cell was programmed. Other methods predict the distortion in a certain cell based on the distortion of other cells located in the same column (bit line) of the memory array. Some disclosed methods correct disturb noise caused by operations on other cells in the array at the time the distortion is created.

In some embodiments, the memory cells are programmed using a Program and Verify (P&V) process, and the MSP compensates for the distortion at the time of programming, or both at the time of programming and at the time of reading the memory cells.

Additionally or alternatively to compensating for the distortion, the MSP can take other types of actions in response to the estimated distortion. For example, the MSP can refresh (i.e., re-program) the data when the estimated distortion exceeds a maximum tolerable level.

The distortion estimation and compensation methods described herein can be used to improve the data storage performance of memory devices in several ways. For example, the error probability achieved when reconstructing the data can be reduced, the achievable storage capacity can be increased, and/or the achievable data retention period can be extended. The improved performance may in turn be used to lower the cost and complexity of memory devices and/or to increase their programming speed. These improvements are especially significant in MLC devices, which are particularly sensitive to distortion.

System Description

Figure 1:
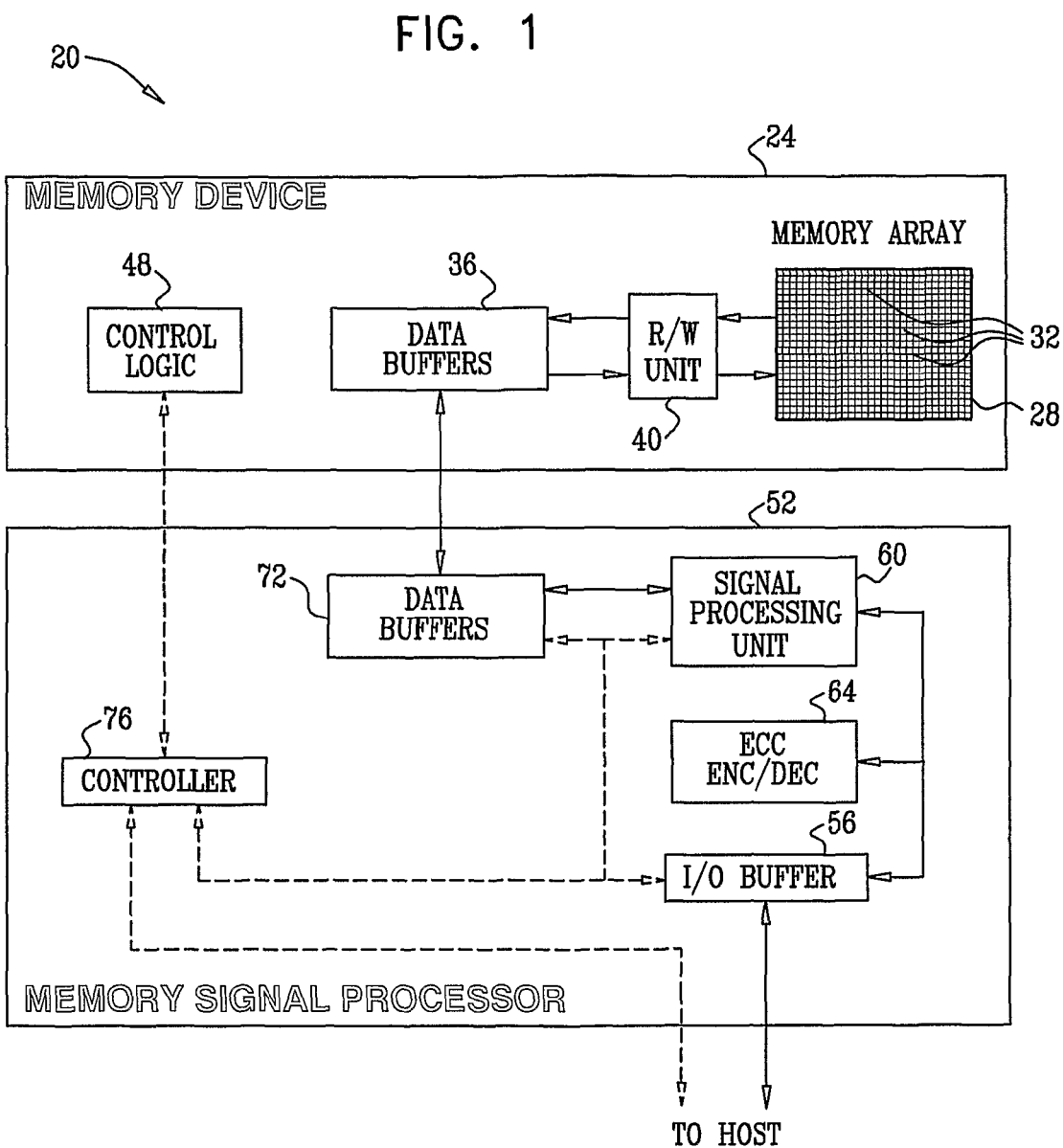
FIG. 1 is a block diagram that schematically illustrates a system for memory signal processing, in accordance with an embodiment of the present invention.

FIG. 1 is a block diagram that schematically illustrates a system 20 for memory signal processing, in accordance with an embodiment of the present invention. System 20 can be used in various host systems and devices, such as in computing devices, cellular phones or other communication terminals, removable memory modules ("disk-on-key" devices), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. The charge levels stored in the cells and/or the analog voltages written into and read out of the cells are referred to herein collectively as analog values.

Data for storage in memory device 24 is provided to the device and cached in data buffers 36. The data is then converted to analog voltages and written into memory cells 32 using a reading/writing (R/W) unit 40, whose functionality is described in greater detail below. When reading data out of array 28, unit 40 converts the electric charge, and thus the analog voltages of memory cells 32, into digital samples. Each sample has a resolution of one or more bits. The samples are cached in buffers 36. The operation and timing of memory device 24 is managed by control logic 48.

The storage and retrieval of data in and out of memory device 24 is performed by a Memory Signal Processor (MSP) 52. As will be shown in detail hereinbelow, MSP 52 uses novel methods for estimating and reducing various distortion effects in memory cell array 28.

In some embodiments, MSP 52 comprises an encoder/decoder 64, which encodes the data to be written to device 24 using an ECC and decodes the ECC when reading data out of device 24. A signal processing unit 60 processes the data that is written into and retrieved from device 24. In particular, unit 60 estimates the distortion that affects the voltages read out of cells 32. Unit 60 may compensate for or otherwise reduce the effect of the estimated distortion. Alternatively, unit 60 may take other types of action based on the estimated distortion, as will be shown further below.

MSP 52 comprises a data buffer 72, which is used by unit 60 for storing data and for interfacing with memory device 24. MSP 52 also comprises an Input/Output (I/O) buffer 56, which forms an interface between the MSP and the host. A controller 76 manages the operation and timing of MSP 52. Signal processing unit 60 and controller 76 may be implemented in hardware. Alternatively, unit 60 and/or controller 76 may comprise microprocessors that run suitable software, or a combination of hardware and software elements.

The configuration of FIG. 1 is an exemplary system configuration, which is shown purely for the sake of conceptual clarity. Any other suitable configuration can also be used. Elements that are not necessary for understanding the principles of the present invention, such as various interfaces, addressing circuits, timing and sequencing circuits, data scrambling circuits and debugging circuits, have been omitted from the figure for clarity.

In the exemplary system configuration shown in FIG. 1, memory device 24 and MSP 52 are implemented as two separate Integrated Circuits (ICs). In alternative embodiments, however, the memory device and MSP may be integrated in a single IC or System on Chip (SoC). In some implementations, a single MSP 52 may be connected to multiple memory devices 24. Further alternatively, some or all of the functionality of MSP 52 can be implemented in software and carried out by a processor or other element of the host system. Additional architectural aspects of certain embodiments of system 20 are described in greater detail in U.S. Provisional Patent Application 60/867,399, cited above, and in a PCT patent application entitled, "Combined Distortion Estimation and Error Correction Coding for Memory Devices," filed May 10, 2007, which is incorporated herein by reference.

In a typical writing operation, data to be written into memory device 24 is accepted from the host and cached in I/O buffer 56. Encoder/decoder 64 encodes the data, and the encoded data is transferred, via data buffers 72, to memory device 24. The data may be pre-processed by MSP 52 before it is transferred to the memory device for programming. In device 24 the data is temporarily stored in buffers 36. R/W unit 40 converts the data to analog voltage values and writes the data into the appropriate cells 32 of array 28.

In a typical reading operation, R/W unit 40 reads analog voltage values out of the appropriate memory cells 32 and converts the voltages to soft digital samples. The samples are cached in buffers 36 and transferred to buffers 72 of MSP 52. In some embodiments, unit 60 of MSP 52 converts the voltage samples to data bits. As noted above, the range of possible threshold voltages is divided into two or more regions, with each region representing a certain combination of one or more data bits. When reading a memory cell, unit 60 typically compares the magnitude of the read voltage sample to a set of decision thresholds, in order to determine the region in which the read voltage falls, and thus the data bits stored in the cell. Blocks of data are transferred from buffers 72 to unit 60, and encoder/decoder 64 decodes the ECC of these blocks. The decoded data is transferred via I/O buffer 56 to the host. In some embodiments, the ECC decoder comprises a soft decoder, and unit 60 converts the voltage samples to soft decoding metrics that are used for decoding the ECC.

Additionally, signal processing unit 60 estimates the distortion that is present in the read samples, using methods that are described hereinbelow. In some embodiments, MSP 52 scrambles the data before it is written into the memory cells, and de-scrambles the data read from the memory cells, in order to improve the distortion estimation performance.

Memory Array Structure and Distortion Mechanisms

Figure 2:
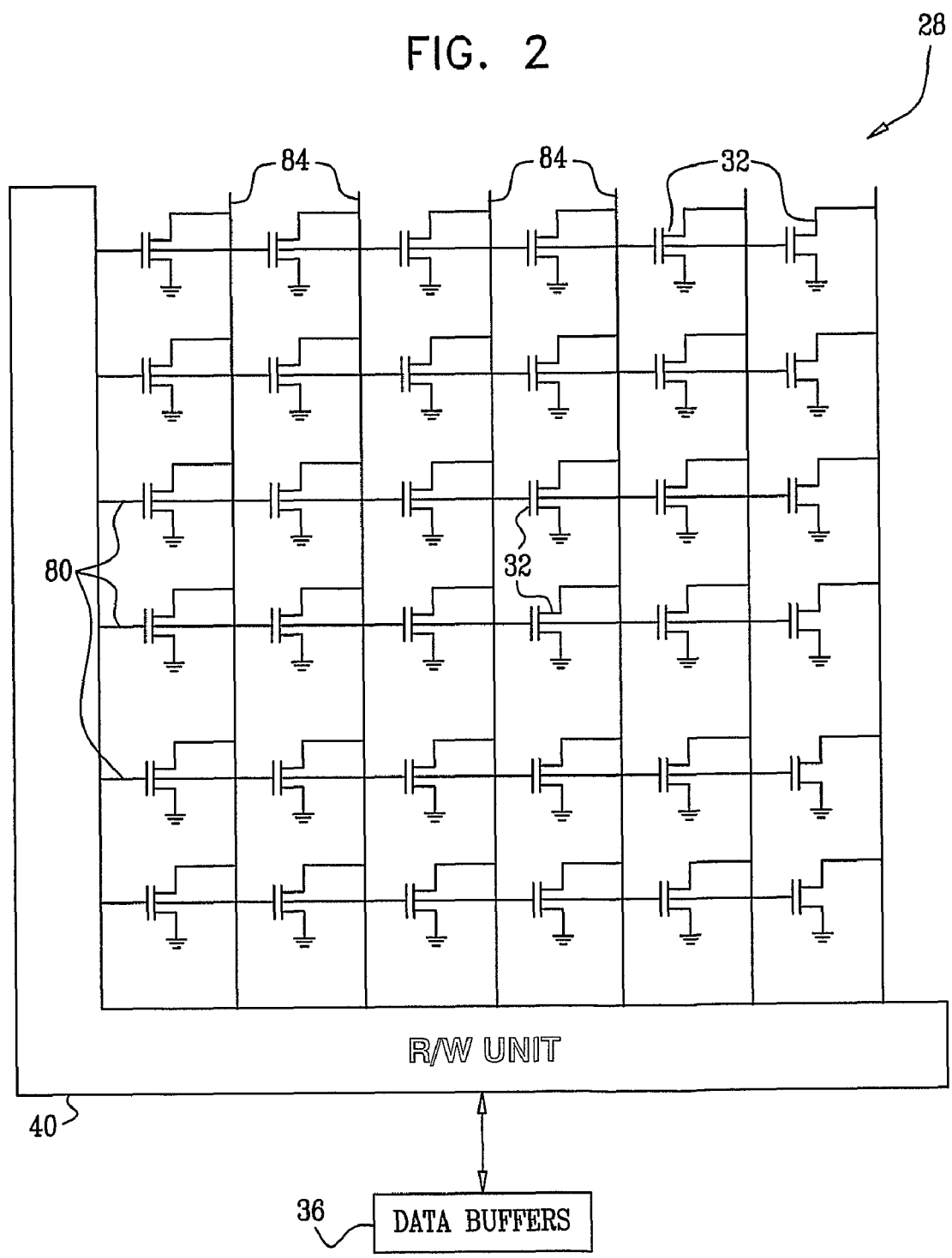
FIG. 2 is a diagram that schematically illustrates a memory cell array, in accordance with an embodiment of the present invention.

FIG. 2 is a diagram that schematically illustrates memory cell array 28, in accordance with an embodiment of the present invention. Although FIG. 2 refers to Flash memory cells that are connected in a particular array configuration, the principles of the present invention are applicable to other types of memory cells and other array configurations, as well. Some exemplary cell types and array configurations are described in the references cited in the Background section above.

Memory cells 32 of array 28 are arranged in a grid having multiple rows and columns. Each cell 32 comprises a floating gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is proportional to the charge stored in the cell.

In the exemplary configuration of FIG. 2, the gates of the transistors in each row are connected by word lines 80. The sources of the transistors in each column are connected by bit lines 84. In some embodiments, such as in some NOR cell devices, the sources are connected to the bit lines directly. In alternative embodiments, such as in some NAND cell devices, the bit lines are connected to strings of floating-gate cells.

Typically, R/W unit 40 reads the threshold voltage of a particular cell 32 by applying varying voltage levels to its gate (i.e., to the word line to which the cell is connected) and checking whether the drain current of the cell exceeds a certain threshold (i.e., whether the transistor conducts). Unit 40 usually applies a sequence of different voltage values to the word line to which the cell is connected, and determines the lowest gate voltage value for which the drain current exceeds the threshold. Typically, unit 40 reads an entire row of cells, also referred to as a page, simultaneously.

In some embodiments, unit 40 measures the drain current by pre-charging the bit line of the cell to a certain voltage level. Once the gate voltage is set to the desired value, the drain current causes the bit line voltage to discharge through the cell. Unit 40 measures the bit line voltage several microseconds after the gate voltage is applied, and compares the bit line voltage to the threshold. In some embodiments, each bit line 84 is connected to a respective sense amplifier, which amplifies the bit line current and converts it to voltage. The amplified voltage is compared to the threshold using a comparator.

The voltage reading method described above is an exemplary method, Alternatively, R/W unit 40 may use any other suitable method for reading the threshold voltages of cells 32. For example, unit 40 may comprise one or more Analog to Digital Converters (ADCs), which convert the bit line voltages to digital samples.

The memory cell array is typically divided into multiple pages, i.e., groups of memory cells that are programmed and read simultaneously. In some embodiments, each page comprises an entire row of the array. In alternative embodiments, each row can be divided into two or more pages. Erasing of cells is usually carried out in blocks that contain multiple pages. Typical memory devices may comprise several thousand erasure blocks. A typical erasure block is on the order of 128 pages, each comprising several thousand cells, although other block sizes can also be used.

The charge levels stored in the memory cells and the voltages read from the cells may contain various types of distortion, which are caused by different distortion mechanisms in array 28. Some distortion mechanisms affect the actual electrical charge that is stored in the cells, while other mechanisms distort the sensed voltages. For example, electrical cross-coupling between adjacent cells in the array may modify the threshold voltage in a particular cell. This effect is referred to as cross-coupling distortion. As another example, electrical charge may leak from the cells over time. As a result of this aging effect, the threshold voltage of the cells may drift over time from the initially-written value.

Another type of distortion, commonly referred to as disturb noise, is caused by memory access operations (e.g., read, write or erase operations) on certain cells in the array, which cause unintended charge variations in other cells. As yet another example, the source-drain current of a particular cell can be affected by the charge in adjacent cells, e.g., other cells in the same NAND cell string, via an effect referred to as Back Pattern Dependency (BPD).

Distortion Estimation and Cancellation Methods

The distortion in memory cells 32 degrades the performance of the memory device, e.g., the error probability when reconstructing the data, the achievable storage capacity and the achievable data retention period. Performance degradation is particularly severe in MLC devices, in which the differences between the different voltage levels that represent the data are relatively small. In many cases, the distortion level varies over time and from one cell to another. Thus, it is highly advantageous to estimate the distortion and act upon the estimated distortion in an adaptive manner.

MSP 52 can apply various methods to estimate the distortion in memory cells 32, and to cancel or otherwise compensate for the distortion using the estimated distortion levels. Additionally or alternatively to compensating for the distortion, the MSP may perform other types of actions based on the estimated distortion.

For example, the MSP can use the estimated distortion for performing data refresh decisions. In a typical implementation, the MSP estimates the distortion levels of various memory cell groups, e.g., memory pages. When the distortion in a particular page exceeds a certain tolerable threshold, the MSP refreshes (i.e., re-programs) the data.

As another example, the MSP can use the estimated distortion for assessing the achievable storage capacity in a certain cell or group of cells. Based on the achievable capacity, the MSP can modify the number of voltage levels and/or ECC used for storing data in the respective cells. Thus, the MSP can adaptively modify the density in which data is stored in the memory cells, to match their storage capacities as they vary with time. Some aspects of using distortion estimation for adapting the storage density of memory devices are described in a PCT patent application entitled, "Memory Device with Adaptive Capacity," filed May 10, 2007, which is incorporated herein by reference.

As yet another example, the MSP can modify the decision thresholds, i.e., the thresholds that divide the range of possible cell voltages into decision regions, based on the estimated distortion. The MSP may adjust the decision threshold values to minimize the distortion level, to minimize the decoding error probability or to meet any other suitable performance condition. The MSP can also modify ECC decoding metrics, such as Log Likelihood Ratios (LLR), which are used by the ECC decoder to decode the ECC. Such methods are described, for example, in the PCT application "Combined Distortion Estimation and Error Correction Coding for Memory Devices," cited above.

FIGS. 3-8 are flow charts that schematically illustrate methods for estimating and canceling distortion in memory cell array 28, in accordance with embodiments of the present invention. In the description that follows, the MSP is assumed to read the memory cells and estimate the distortion levels page by page. In alternative embodiments, however, the MSP can read and process any other group of memory cells. For example, the MSP can process entire erasure blocks or even single cells.

Figure 3:
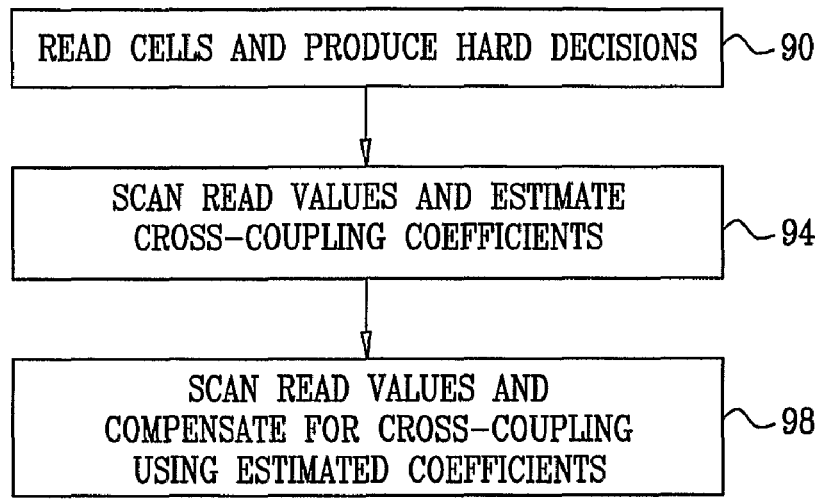
FIGS. 3-8 are flow charts that schematically illustrate methods for estimating and canceling distortion in a memory cell array, in accordance with embodiments of the present invention.

FIG. 3 is a flow chart that schematically illustrates a method for estimating and canceling cross-coupling distortion, in accordance with an embodiment of the present invention. In some cases, such as in Flash memories, cross-coupling distortion is caused by electromagnetic coupling of the electric fields generated by the electrical charges stored in nearby cells. In other cases, such as in NROM memory cells, cross-coupling distortion can be caused by other reasons, e.g., a rise in the source voltage of a memory cell due to shared ground lines.

The voltage read from a certain memory cell i, which is affected by cross-coupling can be generally written as $$v_i = g(c_i) + f(c_j, C_i) \quad [1]$$

wherein $g(c_i)$ denotes the voltage read from the cell when all potentially-interfering cells are erased, $c_i$ denotes the charge level in cell i, $f(c_j, C_i)$ denotes the coupling effect when the cell charge is $c_i$ and $C_i$ denotes the set of charge levels of the neighboring cells, $j \neq i$.

In some practical cases, the cross-coupling can be modeled using a linear function, so that $$v_i = g(c_i) + \sum_{j \neq i} k_{ji}(c_i) \cdot c_j \quad [2]$$

wherein $k_{ji}$ denotes the cross-coupling coefficient, i.e., the magnitude of cross-coupling, from cell j to cell i. The coefficient value may sometimes depend on the charge level of the cell.

In other cases, the cross-coupling caused by a certain interfering cell depends on the charge levels of both the interfering cell and the interfered cell. In these cases, Equation [2] can be written as $$v_i = k_0 \cdot c_i + f(\{c_i, c_j\}, j \neq i) \quad [3]$$

The cross-coupling coefficient values may generally vary from one memory cell to another, and may also vary with temperature, supply voltage and other conditions.

The method of FIG. 3 begins with MSP 52 reading the voltages from a page of memory cells, at a reading step 90. Each read voltage is represented by a soft sample, i.e., a digitized value having a resolution of two or more bits. The MSP generates hard decisions from the read voltage values. In other words, the MSP determines, cell by cell, the nominal voltage level that was most likely to have been written to the cell. The MSP may compare each read voltage to the different nominal voltage values that represent the different bit combinations, and determine the nominal voltage level that is closest to the read voltage. This operation is often referred to as hard slicing.

The MSP estimates the cross-coupling coefficients based on the read voltage samples and on the corresponding hard decisions, at a coefficient estimation step 94. In most practical cases, the majority of the hard decisions reflect the correct bit combinations written to the cells, and only few hard decisions are erroneous. Although the error probability of the hard-decisions may not be sufficient for reliably reconstructing the data, it is typically sufficient for reliable coefficient estimation.

The MSP may use any suitable estimation method for estimating the values of the cross-coupling coefficients. In many practical cases, the coefficient values are substantially constant over the processed cell group. In such cases, the MSP may use various block estimation techniques known in the art, which estimate the coefficients using the entire set of soft voltage samples and corresponding hard decisions.

Alternatively, the MSP may use various sequential estimation methods known in the art, which process the voltage samples and hard decisions sequentially, e.g., sample by sample, and converge to the desired values of the cross-coupling coefficients. The sequential estimation method may comprise, for example, a Least Mean Square (LMS) process, a Recursive Least Squares (RLS) process, a Kalman filtering process, or any other suitable process.

In some embodiments, the estimation process attempts to reduce a distance metric (e.g., Euclidean distance) between the read voltages and the corresponding hard decisions.

For example, when using an LMS process, the MSP may iteratively evaluate the expression $$k_{ji}^{(t+1)} = k_{ji}^{(t)} + \mu \cdot v_j^{(t)} \cdot e_i^{(t)} \quad [4]$$

wherein t denotes an incrementing index that advances along the processed samples and hard decisions (e.g., a sample index). $k_{ji}^{(t)}$ denotes the estimated value of cross-coupling coefficient $k_{ji}$ at iteration t. $\mu$ denotes a predetermined iteration step size, $v_j^{(t)}$ denotes the voltage sample read from cell j at iteration t. $e_i^{(t)}$ is defined as $e_i^{(t)} = v_i^{(t)} - \hat{v}_i^{(t)}$, i.e., the difference between the read voltage at iteration t and the corresponding hard decision (nominal voltage) $\hat{v}_i^{(t)}$. Note the unlike Equation [2] above in which the cross-coupling coefficients multiply the charge levels of the cells, in Equation [4] the coefficients multiply the cell voltages.

In some embodiments, the value of $k_{ji}$ can be estimated during the programming of the cells by measuring the change in the cell voltage $v_i$ caused by programming cell j.

The MSP compensates for the cross-coupling distortion in the read voltages based on the estimated cross-coupling coefficients, at a cross-coupling compensation step 98. The MSP typically produces corrected voltages, in which the level of cross-coupling distortion is reduced. For example, the MSP can sum the estimated cross-coupling distortion components, which originate from different interfering cells and affect a certain read voltage, and subtract the sum from the cell voltage. This operation is sometimes referred to as linear equalization.

The MSP may alternatively cancel the cross-coupling distortion by applying Decision Feedback Equalization (DFE), as is known in the art. In alternative embodiments, the MSP can cancel the cross-coupling distortion using a reduced-state Maximum Likelihood Sequence Estimation (MLSE) process, such as using the well-known Viterbi algorithm. Further alternatively, the MSP can use a Maximum A Posteriori (MAP) estimation process or any other suitable method for compensating for the cross-coupling distortion based on the estimated cross-coupling coefficients.

The MSP reconstructs the data stored in the memory cells using the corrected voltages. In some embodiments, the MSP processes the read voltages in two passes (i.e., scans over the read voltage values twice). In the first pass, the MSP estimates the cross-coupling coefficients. In the second pass, the MSP corrects the read voltages and reconstructs the data using the estimated coefficients. Two-pass processing may be advantageous, for example, when different blocks or pages of memory cells have different cross-coupling coefficient values, such as because the cells were written at different temperatures, supply voltages or other conditions. In alternative embodiments, the MSP can perform coefficient estimation, distortion compensation and data reconstruction in a single pass.

In an alternative embodiment, the MSP initially performs coefficient estimation and data reconstruction in a single pass. The MSP then estimates the quality of the reconstructed data (e.g., by detecting errors that were not corrected by the ECC), and carries out a second pass if the data reconstruction quality is too low. This technique does not change the average processing delay or processing power considerably, and is advantageous in situations in which the coefficients change over time.

As noted above, in some embodiments the MSP scrambles the data before it is written to the memory cells, in order to prevent non-random data from degrading the estimation accuracy.

In some distortion mechanisms, the distortion level in a particular memory cell is correlative with the distortion levels of other cells located along the same bit line. For example, in some NAND Flash memories the cells along each bit line are connected to one another in groups of sixteen or thirty-two cells, referred to as strings. The voltage read from a particular cell often depends on the voltage of the other cells in the string. This effect is commonly referred to as Back Pattern Dependency (BPD). As another example, parameter variations and other distortion caused by the sense amplifier may also be correlative in different cells along a bit line.

In other scenarios, the distortion level in a particular memory cell can be correlated with the distortion levels of other cells located along the same word line. For example, consider a certain cell that requires a significantly longer time to be programmed, in comparison with other cells in the same page. When the page in question is being programmed, most cells reach their intended charge levels after a certain number of P&V iterations, but the charge level in the "slow" cell is still far from desired level. The source-drain current of the slow cell is thus low. The slow cell continues to be programmed using additional P&V iterations and its current increases. The increased current increases the voltage dropped on the ground line, and the source-drain voltage of the other cells in the page. As a result, the threshold voltages of the other cells in the page drop.

Although the description of FIG. 4 below refers to correlative distortion along the bit line, the method of FIG. 4 can also be used for predicting and compensating for distortion that is correlative along the word line. Further alternatively, the method can be used to predict and correct any other distortion mechanism in which the distortion levels of cells in a certain group are correlative with one another, such as cells located in close proximity to one another in the array, and cells having common supply voltage (Vcc) lines, ground lines or power supply circuitry.

When the distortion levels of the cells along a certain bit line are correlative, the distortion level can sometimes be modeled as $$e(n, m) = \sum_{i>n} f_i(c(i, m)) + \sum_{i<n} g_i(c(i, m)) \quad [5]$$

wherein e(n,m) denotes the distortion level in the cell at column (bit line) m and row (page) n. c(i,m) denotes the voltage read from the cell at the m'th bit line of the i'th page. $f_i$ and $g_i$ denote functions that define the dependence of the voltage of a cell at page i on the cells along the same bit line in previous pages and in subsequent pages, respectively. Equation [5] assumes that pages are processed sequentially.

Figure 4:
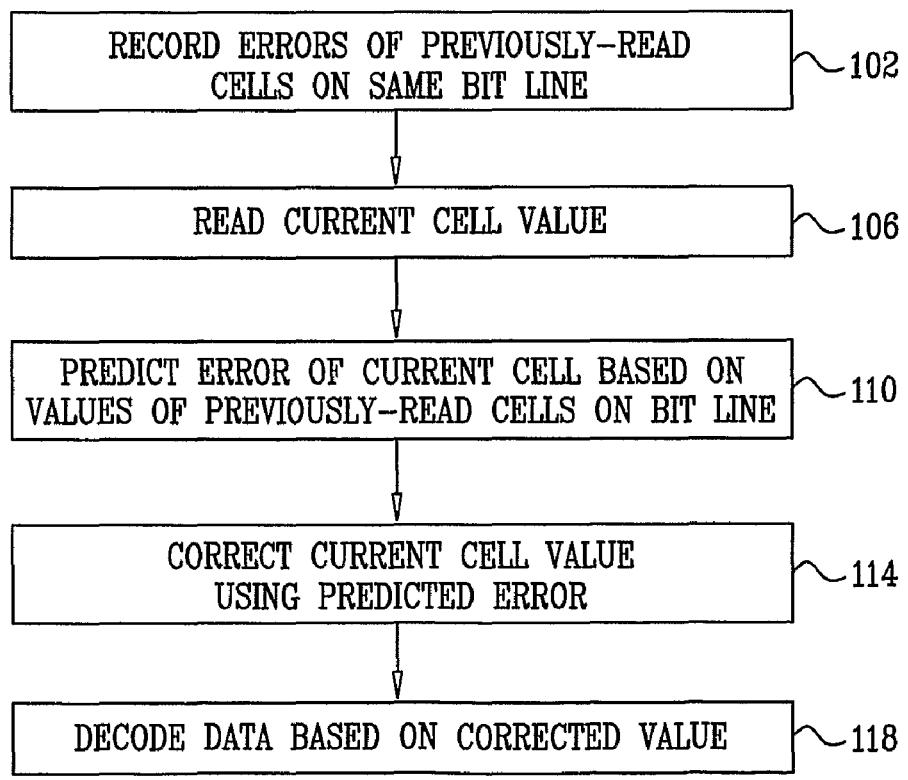

FIG. 4 is a flow chart that schematically illustrates an iterative method for predicting and canceling bit line correlative distortion, in accordance with an embodiment of the present invention. The method begins with the MSP recording the distortion levels of previously-read memory cells, at a distortion recording step 102. The MSP may calculate the distortion level using any suitable method, such as by comparing the read voltage to the expected nominal voltage, possibly after ECC decoding.

The MSP reads the voltage of a particular memory cell, referred to as the target cell, at a target reading step 106. The MSP then predicts the distortion level in the target cell based on the recorded distortion values of other cells along the same bit line, and on the voltages read from these cells, at a prediction step 110. The MSP may, for example, predict the distortion level using Equation [5] above.

The MSP corrects the voltage read from the target cell using the estimated distortion level, at a correction step 114. The MSP then decodes the data stored in the target cell based on the corrected voltage, at a decoding step 118. When the ECC decoder comprises a soft decoder, the MSP can alternatively correct the soft ECC metrics (e.g., LLR) of the bits stored in the cell, based on the estimated distortion level. Such correction methods are described, for example, in the PCT application "Combined Distortion Estimation and Error Correction Coding for Memory Devices," cited above.

Although the description of FIG. 4 above addresses a single target cell for the sake of clarity, the prediction and correction process is typically carried out in parallel on multiple memory cells, as pages are read from memory.

In order to improve memory efficiency, the MSP can store only a single distortion value for each bit line, instead of recording and storing the distortion level of each previously-read cell. The stored value, denoted ê(m), represents the estimated value of e(n,m) after reading the n'th page. For the first page that is read, ê(m) is typically initialized to zero.

When decoding the n'th page, the MSP updates the value of ê(m), such as using the expression $$\hat{e}(m)=(1-\delta_n)\cdot\hat{e}(m)+\delta_n\cdot[c(n,m)-\tilde{c}(n,m)] \quad [6]$$

wherein $\delta_n$ denotes a predetermined step size for the n'th page. c(n,m) denotes the voltage read from the cell at the m'th bit line of the n'th page, and $\tilde{c}(n,m)$ denotes the nominal voltage of the cell based on the decoder output. When reading page n+1, the MSP can predict the distortion based on ê(m) by evaluating $\hat{e}(m)=\hat{e}(m)-f_{n+1}\cdot c(n+1,m)+g_n\cdot c(n,m)$. The corrected voltage (e.g., c(n+1,m)−ê(m)) is used for decoding the data.

The method described above can be particularly effective in predicting and correcting the varying gain, bias or other varying parameters of the sense amplifier. Such parameters may also comprise a varying bias or widening of a particular voltage level distribution or of the joint distribution of all voltage levels.

When the method is used to correct BPD distortion in an array of NAND Flash cells, there may exist a particular cell that contributes most of the distortion, such as because it is over-programmed. In such a case, the iterative method can be repeated over the NAND cell string until this cell is identified, at which point the value of ê(m) is reset. Unlike correcting BPD distortion, which is typically performed per NAND cell string, sense amplifier variations are typically tracked and performed per the entire bit line.

In some embodiments, MSP 52 maintains a table or other data structure that holds the tracked parameters per bit line, word line or other correlative cell group.

As noted above, some memory cells may be affected by disturb noise, i.e., distortion caused by operations performed on other cells in the array. In some embodiments, MSP 52 corrects the disturb noise at the time it is created, rather than when the interfered cell is read.

Figure 5:
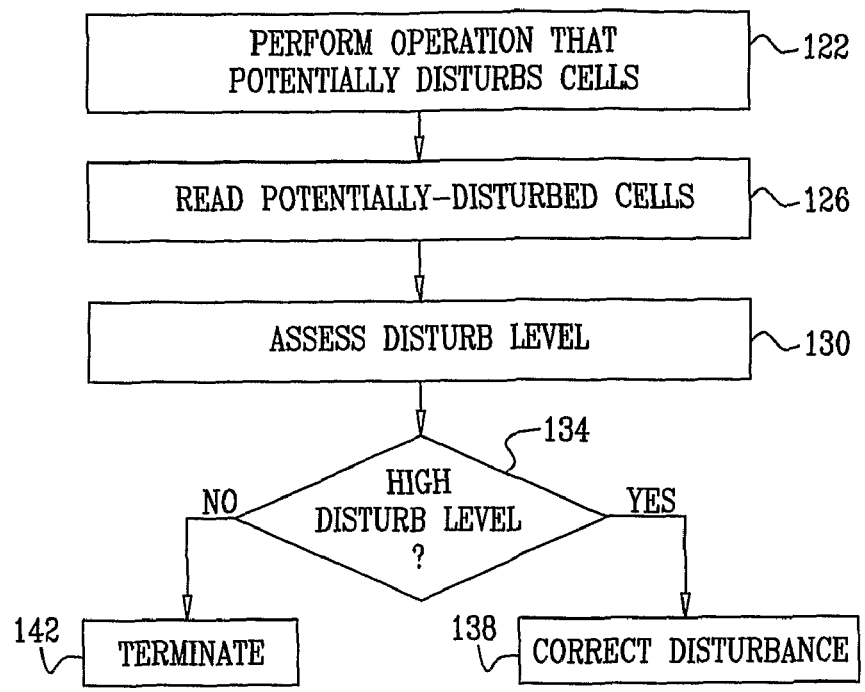

FIG. 5 is a flow chart that schematically illustrates a method for correcting disturb noise, in accordance with an embodiment of the present invention. The method begins with MSP 52 performing a memory access operation that may contribute disturb noise to some of the memory cells, at a disturb-creating operation step 122. The memory access operation may comprise, for example, a programming, reading or erasure operation. The MSP reads the voltages from the memory cells that may be disturbed by the memory access operation, at a potentially-disturbed cell reading step 126.

The MSP assesses the level of disturb noise in the potentially-disturbed cells, at a disturb estimation step 130. The MSP can use any suitable distortion estimation method for this purpose. For example, the MSP can use a decision-directed method, in which the voltages read from the cells are compared with respective nominal voltage levels determined by hard slicing, or with nominal voltage levels determined by applying ECC decoding to the voltages read from the cells.

In some cases, the disturb noise can increase the charge level in some of the erased cells in a neighboring page. In such a case, the MSP can assess the disturb level by counting the number of erased cells (i.e. cells whose voltage is below a certain threshold level, which may be different from the threshold level normally used to detect erased cells) in a potentially-disturbed page. The MSP can compare the number of erased cells before and after a potentially-disturbing memory access operation, and assess the level of disturb from the difference between the two results.

The MSP checks whether the estimated disturb level exceeds a predefined threshold, at a high disturb checking step 134. If the disturb level is regarded as high, the MSP corrects the disturb noise in the potentially-disturbed cells, at a disturb correction step 138. For example, the MSP may refresh the data in the same cells, re-program the data in other cells (e.g., in another page), or add charge to the existing programmed cells. The MSP may also encode the data using a stronger ECC and store the newly-encoded data in another page. Otherwise, i.e., if the disturb level is regarded as tolerable, the method terminates, at a termination step 142.

In some cases, carrying out the process of FIG. 5 after every read, write and erase operation may increase the processing time considerably. Therefore, in some embodiments, the MSP carries out the method of FIG. 5 during time periods in which the system is idle.

Figure 6:
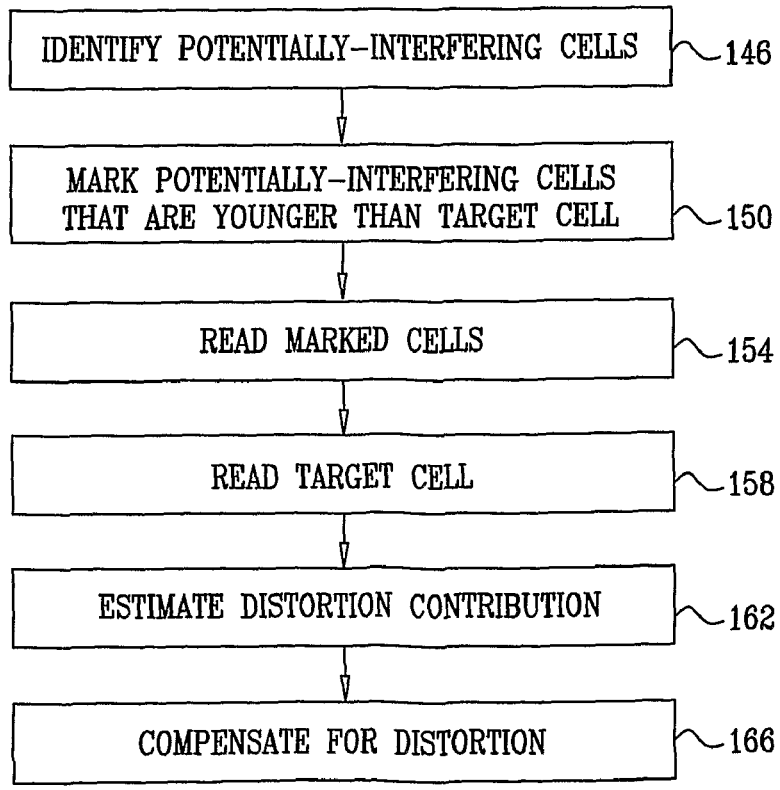

FIG. 6 is a flow chart that schematically illustrates another method for correcting disturb noise, in accordance with an alternative embodiment of the present invention. The method is based on the fact that disturb noise is contributed to a certain target cell by cells that were programmed more recently than the target cell. For the sake of brevity, cells that were programmed more recently than the target cell are referred to as being "younger" than the target cell. Cells programmed earlier than the target cell are referred to as "older" cells.

The method begins with MSP 52 identifying the cells that potentially cause disturb noise to the target cell, at a potentially-interfering cell identification step 146. The MSP then identifies and marks which of the potentially-interfering cells are younger than the target cell, at a younger cell identification step 150. In some embodiments, the MSP stores an indication of the time in which each page was programmed, often as part of the page along with the data. The MSP queries the stored indication in order to determine which cells are younger than the target cell.

When memory pages are written in sequential order, the MSP can regard the cells in higher-number pages with respect to the target cell as younger. Alternatively, when the memory pages are not written in sequential order, the MSP can store in each page a variable that indicates it its relative age with respect to the neighboring pages. The variable is set and stored when the page is programmed. For example, the variable may comprise the value of a counter that counts the number of pages that were programmed so far in the erasure block. Alternatively, the variable may comprise a Boolean flag per each neighboring page, which indicates whether the neighboring page was programmed or erased when the current page was programmed. Further alternatively, the MSP can use any other suitable method for determining the potentially-interfering cells that are younger than the target cell.

MSP 52 reads the voltages of the marked cells (i.e., the potentially-interfering cells that are younger than the target cell), at an interfering cell reading step 154. The MSP may re-read the interfering cells and/or use the ECC decoder to reliably decode the data stored in the potentially-interfering cells. The MSP also reads the voltage of the target cell, at a target cell reading step 158. In some embodiments, the voltage of the target cell is read with a high resolution, such as using an ADC having a number of bits that is higher than the number of data bits stored in each cell. The voltages of the marked cells can sometimes be read with a reduced resolution.

The MSP estimates the level of disturb noise contributed to the target cell by the younger potentially-interfering cells, at a disturb contribution estimation step 162. The estimated disturb level may depend on the relative ages of the potentially-interfered cells, the voltage values and/or data stored in the potentially-interfering cells, the location of the potentially-interfering cells with respect to the target cell (e.g., whether they are located in a neighboring page, a second neighboring page, etc.), the number of recent programming-erasure cycles of the interfered cells, and/or any other information or criterion. An effective estimate of the level of disturb is its average value conditioned on the above parameters.

The MSP compensates for the estimated disturb level, at a disturb cancellation step 166. For example, the MSP may subtract the estimated disturb level from the voltage read from the target cell, to produce a corrected voltage. The corrected voltage is used for decoding the data stored in the target cell or for modifying ECC decoder metrics.

Although the description above addresses a single target cell for the sake of clarity, the process of FIG. 6 may be carried out in parallel for multiple target memory cells, as pages are read from memory.

In some embodiments, the memory cells are programmed using a Program and Verify (P&V) process, and MSP 52 applies distortion compensation when programming the cells. In some embodiments, the MSP applies distortion compensation during both programming and reading of the memory cells.

P&V processes are commonly used for programming memory cells. In a typical P&V process, a cell is programmed by applying a sequence of voltage pulses, whose voltage level increases from pulse to pulse. The programmed voltage level is read ("verified") after each pulse, and the iterations continue until the desired level is reached. P&V processes are described, for example, by Jung et al., in "A 117 mm$^2$ 3.3V Only 128 Mb Multilevel NAND Flash Memory for Mass Storage Applications," IEEE Journal of Solid State Circuits, (11:31), November, 1996, pages 1575-1583, and by Lee et al., in "Effects of Floating Gate Interference on NAND Flash Memory Cell Operation," IEEE Electron Device Letters, (23:5), May, 2002, pages 264-266, which are both incorporated herein by reference.

Figure 7:
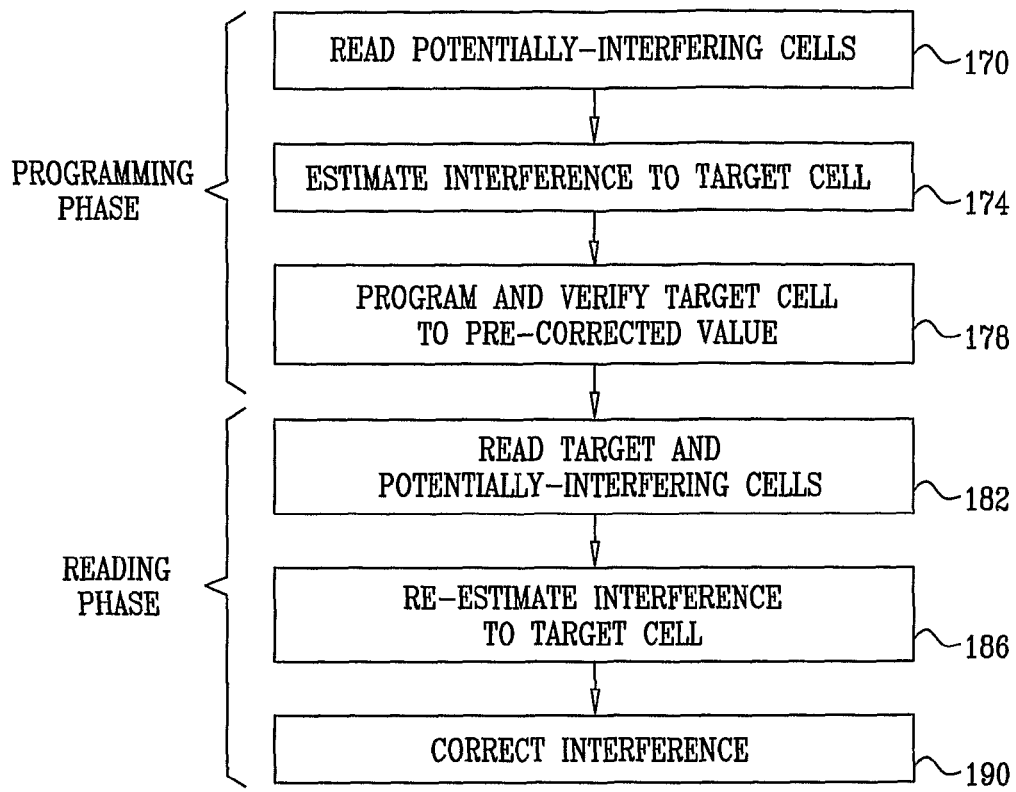

FIG. 7 is a flow chart that schematically illustrates a method for estimation and cancellation of distortion in memory cell array 28, in accordance with another embodiment of the present invention. Unlike some known P&V processes, which verify that the voltage read from the cell reaches the desired value, the method of FIG. 7 causes the electrical charge stored in the memory cell to reach the desired charge, which represents the stored data.

Verifying the charge level stored in the cell instead of the read voltage is advantageous, since the distortion level may be different between the time of writing and the time of reading. The method can be used for compensating for any distortion type or mechanism.

The method begins when MSP 52 intends to program a certain page. For a given target cell in the page to be programmed, the MSP reads the cells that potentially cause distortion to the target cell, at a potentially-interfering cell reading step 170. (In some cases the MSP already possesses these values because they were recently programmed, in which case it is not necessary to read the cells.) The MSP estimates the distortion caused by the potentially-interfering cells to the target cell, at a distortion calculation step 174. The MSP may use any suitable method, such as the various estimation processes described hereinabove, for estimating the distortion level.

The MSP calculates a pre-corrected voltage value for programming the target cell, based on the estimated distortion. Typically, the MSP produces the corrected voltage by subtracting the estimated distortion level from the nominal voltage level intended for storage in the cell.

The MSP programs the target cell with the pre-corrected voltage using the P&V process, at a pre-corrected programming step 178. As a result, the charge level stored in the target cell genuinely reflects the data written to the cell, since it is pre-corrected to remove the distortion present at the time of writing.

When reading the target cell, which may occur long after the cell was programmed, the MSP reads the target and the potentially-interfering cells, at a cell reading step 182. The MSP re-estimates the distortion caused by the potentially-interfering cells to the target cell at the time of reading, at a distortion re-estimation step 186. The MSP may use any suitable method, such as the various estimation processes described hereinabove, for re-estimating the distortion level.

As noted above, the target cell may have been programmed a long time ago, and operating conditions such as temperature and supply voltage may have changed, Moreover, additional potentially-interfering cells may have been read, programmed or erased after the target cell was programmed. Thus, the level of distortion calculated at step 186 may differ significantly from the distortion level calculated at step 174 above.

The MSP corrects the voltage read from the target cell based on the re-estimated distortion, at a correction step 190. The corrected voltage is used for decoding the data from the target cell. Decoding the cell data can be performed iteratively, in a decision-directed manner, in order to reduce the distortion when reading the voltages of the interfering cells.

In the method of FIG. 7, the distortion is corrected both at the time of writing and at the time of reading the cells, and each correction uses the actual distortion level that is currently present. Thus, the method is more robust and more tolerant to changes in operating conditions and to subsequent programming operations, with respect to known P&V processes.

In some embodiments, distortion correction is applied only during programming, and the cells are read without a second distortion correction. In these embodiments, steps 182-190 of the method of FIG. 7 are omitted, and the MSP should take into account interference from cells that have not yet been programmed.

Figure 8:
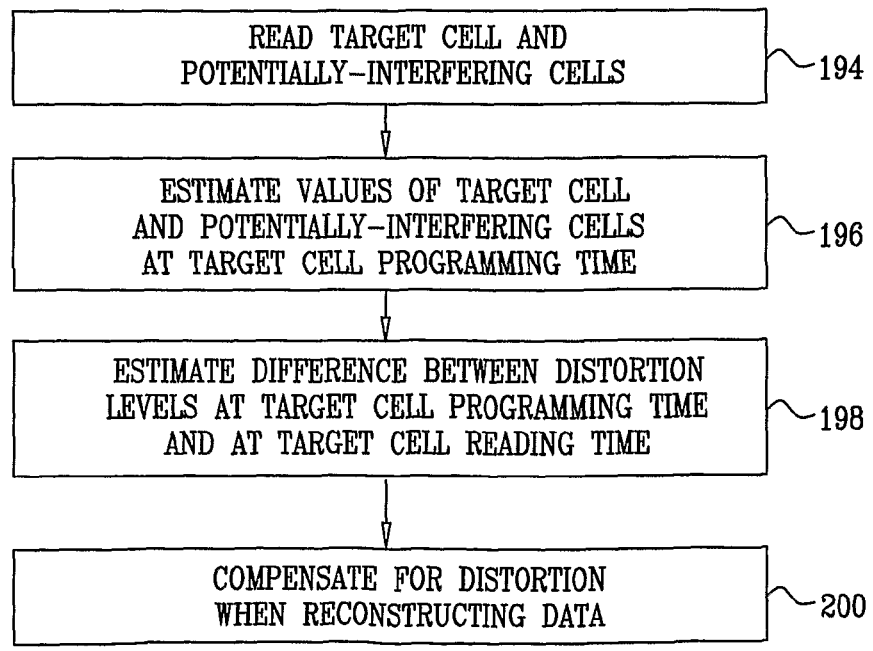

FIG. 8 is a flow chart that schematically illustrates yet another method for estimating the distortion in a target memory cell, in accordance with an embodiment of the present invention. The method of FIG. 8 uses the fact that distortion caused by cells that were programmed earlier than the target cell may differ from the distortion caused by cells that were programmed more recently than the target cell.

Another assumption is that the array has been programmed using a P&V process, as described above. In some known P&V processes, such as in the article by Jung et al., cited above, each cell in a certain page is programmed to one of M voltage levels denoted 0 . . . M−1, wherein level 0 is the erased level. The P&V process programs the page in M phases. In phase i, a sequence of voltage pulses is applied to the cells whose programmed level should be i or higher. After each pulse, the process reads the voltages of the different cells and stops applying pulses to the cells that have reached their desired levels.

In some embodiments, for a given target cell, the MSP classifies the potentially-interfering cells according to the time of programming. (As noted above, the MSP may store an indication of the time in which each page was programmed, and use the stored indication in the classification process.) A subset of the cells, which is denoted D1, comprises potentially-interfering cells, which were not yet fully programmed by the P&V process at the time the target cell was programmed. Cells in class D1 were either at the erased level or partially programmed when the target cell was programmed, but may have been programmed since then.

In some programming schemes, cells are programmed in several stages. For example, in some programming methods of four-level cells, the Least Significant Bit (LSB) and the Most Significant Bit (MSB) are written in two separate steps. An exemplary method is described by Takeuchi et al., in "A Multipage Cell Architecture for High-Speed Programming Multilevel NAND Flash Memories," IEEE Journal of Solid-State Circuits, (33:8), August 1998, pages 1228-1238, which is incorporated herein by reference. In such methods, a cell may be programmed to an intermediate level at a certain point in time, and a future programming step brings the cell to its final programmed value. When such programming methods are used, class D1 is extended to include the cells that were either at the erased level or at an intermediate programming level when the target cell is programmed, but may have been programmed to their final value since then.

Another subset of cells 32, denoted D2, comprises potentially-interfering cells, which were already programmed at the time the target cell was programmed. Since the interference from these cells to the target cell was already present when the target cell was programmed, the P&V process already compensated for this interference, at least partially. A third class of cells, denoted D3, comprises potentially-interfering cells that are programmed concurrently with the target cell, e.g., cells on the same page as the target cell.

MSP 52 can estimate the distortion to the target cell according to the different classes of potentially-interfering cells. Let n and m denote the row and column number of the target cell in array 28, respectively. $x_{n,m}$ denotes the voltage of the target cell after it was written using the P&V process. $x_{i,j}$ denotes the voltage of the cell located in row i and column j at the time the target cell voltage was verified following its last programming iteration. $y_{n,m}$ denotes the cell voltage value read from the target cell, which differs from $x_{n,m}$ due to distortion.

The aggregate distortion present in $y_{n,m}$ can be written as $$e_{n,m} = \sum_{(i,j) \in D_1} h_{n,m,i,j}(y_{i,j} - x_{i,j}) + \sum_{(i,j) \in D_2} h_{n,m,i,j}(y_{i,j} - \hat{x}_{i,j}) + \sum_{(i,j) \in D_3} h_{n,m,i,j} \cdot \max\{y_{i,j} - y_{n,m}, 0\} + b \quad [7]$$

wherein $h_{n,m,i,j}$ denotes the cross-coupling interference coefficient from the interfering cell at row i and column j to the target cell at row n and column m. b denotes a constant bias term. Although Equation [7] above refers to a linear distortion model, non-linear models can also be used.

The cells in class D1 include cells that were programmed after the target cell was programmed. Therefore, the interference caused by the charge added to these cells due to this programming operation was not present at that time, and the P&V process could not have compensated for this distortion.

The cells in class D2 were already programmed when the target cell was programmed, and the distortion caused by these cells was already present when the P&V process programmed the target cell. Therefore, the P&V process has already (at least partially) compensated for this distortion when the target cell was programmed. Nevertheless, this compensation was correct at the time the target cell was programmed, and does not take into account aging, charge leakage and other effects that occurred between that time and the time in which the target cell was read. $\hat{x}_{i,j}$ in the second term of Equation [7] above is an estimate of the voltage, which was present in the interfering cell at the time the target cell was programmed.

In some embodiments, $\hat{x}_{i,j}$ can be estimated by applying ECC decoding to the outputs of these cells. The ECC can help in correcting severe errors, such as errors caused by severe leakage, by recovering the set of bits that was written to the cell. Alternatively, $y_{i,j}-\hat{x}_{i,j}$ in the second term of Equation [7] can be estimated using a memoryless function of $y_{i,j}$, or a memoryless function of $\hat{x}_{i,j}$ such as $a \cdot y_{i,j}$ (or $a \cdot \hat{x}_{i,j}$) which estimates the leakage error for cells whose voltage level is $y_{i,j}$.

The third term in Equation [7] above, which refers to the cells in class D3, assumes the use of a P&V process, which inherently compensates for the distortion caused by D3 cells that are programmed to levels that are the same as or lower than the target cell. When a potentially-interfering cell on the same page as the target cell is programmed to a higher level, this programming is typically performed in a later pass of the P&V process, after the target cell has already been fully programmed. Therefore, a significant part of the distortion caused by D3 cells having higher levels than the target cell will not be present at the time the target cell is programmed, and the P&V process will not be able to compensate for this part of the distortion. The third term of [7] above is particularly effective when using P&V processes that program all the bits of a given cell in a single operation, such as the process described in the article by Jung et al., cited above. When using P&V processes that program different data bits to the cells in multiple stages, such as the method described in the article by Takeuchi et al., cited above, the third term of Equation [7] above can be omitted.

The method of FIG. 8 begins with MSP 52 reading the voltages from memory cells 32 of array 28, at a voltage reading step 194. The voltages comprise both the voltages of the target cells and the voltages of cells that potentially cause interference to the target cells. In the present example, the pages of array 28 are read in a sequential order, i.e., row by row, although other reading configurations can also be used.

The MSP estimates the values (e.g., charge levels) of the target cell and the potentially-interfering cells at the time the target cell is programmed, at a program-time estimation step 196. The estimation may take into account factors such as the voltages read from the target cell and the potentially-interfering cells, the order of programming of the target cell and the potentially-interfering cells, the time that passed since previous programming-erasure cycles, the number of erasure cycles the cells have gone through, environmental parameters such as supply voltage and temperature, etc.

The MSP then estimates the difference between the estimated distortion levels that occurred at the time the target cell was programmed and at the time the target cell was read, at a write-read difference estimation step 198. The MSP may use Equation [7] above to estimate this difference. The MSP compensates for the distortion using the estimated difference (e.g., subtracts the difference from the voltage read from the target cell or adjusts the ECC metrics), at a correction step 200.

In some P&V processes, pages are written to memory in sequential order, from lower-number to higher-number pages. Thus, when cell $x_{n,m}$ is programmed, the cells in pages $i \leq n$ are already programmed, and it can be assumed that the P&V process compensates for the distortion contributed by these cells.

In some embodiments, MSP 52 reads the pages in reverse order with respect to the order in which the pages were written, i.e., from high-number pages to low-number pages. When reading page n, the MSP calculates a distortion metric $M_m(n)$ for each cell column m:

$$M_m(n) = \begin{cases} f_n(X_{N,m}, X_{N-1,m}, \ldots, X_{n+1,m}) & n < N \\ 0 & n = N \end{cases} \quad [10]$$

wherein N denotes the number of rows (word lines) in the erasure block, and $X_{i,j}$ denotes the voltage read from the cell at row i and column j. The assumption is that the distortion affects only cells within the erasure block in question. The MSP removes the distortion metric from the voltages read from the current page by calculating $\hat{x}_{n,m}=y_{n,m}-M_m(n)$. Exemplary functions that can be used as function f may comprise $$\sum_{i=1}^{N+1} X_{i,m} \text{ or } \sum_{i=1}^{N+1} \alpha \cdot X_{i,m}^{i-N}.$$

In alternative embodiments, the MSP processes an entire block of cells concurrently. Using the data to be programmed and the cross-coupling coefficients $h_{n,m,i,j}$ the MSP calculates the error between the programmed and read values, and compensate for this error.

Although the exemplary method of FIG. 8 refers to certain P&V process implementations, the method can be used, mutatis mutandis, with any other suitable P&V process. Adaptation of the method for use with other types of P&V processes on the basis of the disclosed embodiments will be apparent to those skilled in the art.

Data Refreshing Based on Distortion Estimation

In some embodiments, MSP 52 refreshes (i.e., re-programs) the data stored in memory array 28 based on the estimated distortion level.

Figure 9:
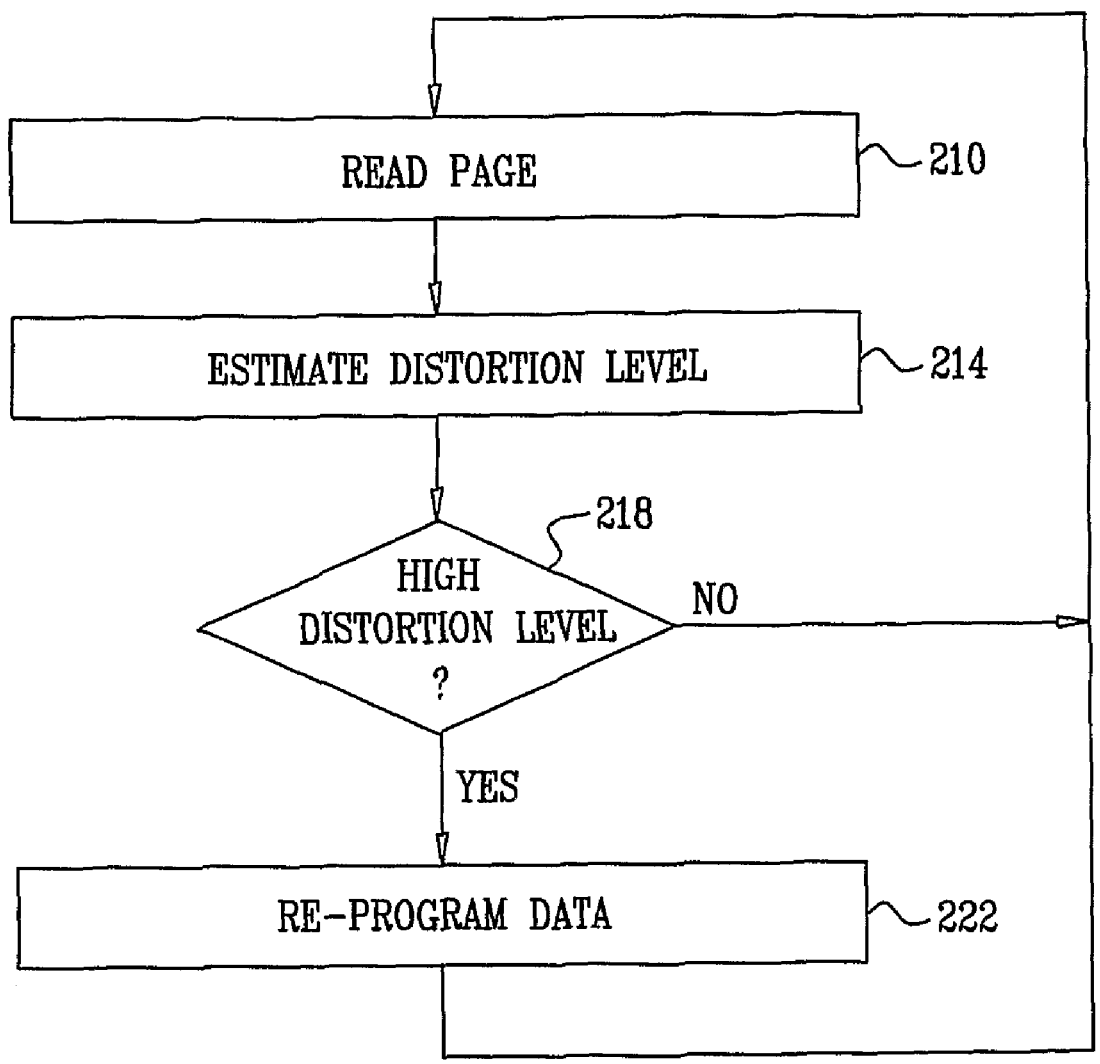
FIG. 9 is a flow chart that schematically illustrates a method for refreshing data in a memory cell array, in accordance with embodiments of the present invention.

FIG. 9 is a flow chart that schematically illustrates a method for refreshing data in a memory cell array, in accordance with embodiments of the present invention. The method begins with MSP 52 reading a memory page from array 28, at a page reading step 210. The MSP estimates the distortion level in the read page, at a page distortion estimation step 214. The MSP can use any suitable distortion estimation method, such as the methods described hereinabove, for this purpose.

The MSP checks whether the distortion level is tolerable, at a distortion level checking step 218. For example, the MSP may compare the estimated distortion level to a predetermined threshold that indicates the maximum tolerable distortion level. The maximum tolerable distortion level is typically chosen so that, when the threshold is reached, the decoded data is still error-free with high likelihood. This condition ensures that the refreshed data is likely to be free of errors.

If the distortion level is tolerable, the method loops back to page reading step 210 above, and the MSP continues to read and examine the memory pages.

If, on the other hand, the MSP determines that the level of distortion in the read memory page is higher than the tolerable level, the MSP re-programs the data of the page, at a re-programming step 222. The method then loops back to page reading step 210 above.

Unlike some known memory refreshing methods in which re-programming is performed periodically, regardless of the distortion level, the method of FIG. 9 re-programs the data only when necessary. Thus, the frequency of re-programming operations is reduced with respect to these known methods. Typically, the method of FIG. 9 is combined with the normal operation of system 20. In other words, the MSP uses the normal page reading and/or distortion estimation operations to assess whether refreshing is needed, without performing dedicated reading operations.

Although the embodiments described herein mainly address retrieving data from multilevel cells (MLC), the principles of the present invention can also be used with single-level cells (SLC). Although the embodiments described herein mainly address retrieving data from solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for operating a memory, comprising:
storing data in a group of analog memory cells of the memory as respective first voltage levels, selected from a set of possible values corresponding to respective possible combinations of data bits to be stored in the analog memory cells;
after storing the data, reading from the analog memory cells respective second voltage levels, which are affected by cross-coupling interference causing the second voltage levels to differ from the respective first voltage levels;
processing the second voltage levels to derive respective hard decisions, each hard decision specifying a respective combination of the data bits selected from among the possible combinations of the data bits;
calculating respective differences between the second voltage levels that were read from the analog memory cells and the respective first voltage levels corresponding to the hard decisions;
estimating cross-coupling coefficients, which quantify the cross-coupling interference among the analog memory cells, based on the differences; and
reconstructing the data stored in the group of analog memory cells from the read second voltage levels using the estimated cross-coupling coefficients.

2. The method according to claim 1, wherein estimating the cross-coupling coefficients comprises processing the second voltage levels and the respective hard decisions using a block estimation process.

3. The method according to claim 1, wherein estimating the cross-coupling coefficients comprises sequentially scanning the second voltage levels and the respective hard decisions using a sequential estimation process that converges to the cross-coupling coefficients.

4. The method according to claim 1, wherein estimating the cross-coupling coefficients comprises applying an estimation process that reduces a distance metric between the read second voltage levels and the respective hard decisions.

5. The method according to claim 1, and comprising evaluating the cross-coupling interference caused by a first analog memory cell to a second analog memory cell in the memory based on both the second voltage level read from the first analog memory cell and on the second voltage level read from the second analog memory cell.

6. The method according to claim 1, wherein reconstructing the data comprises removing the cross-coupling interference from the second voltage levels using one of a linear equalization process, a Decision-Feedback Equalization (DFE) process, a Maximum a Posteriori (MAP) estimation process and a Maximum-Likelihood Sequence Estimation (MLSE) process.

7. The method according to claim 1, wherein estimating the cross-coupling coefficients and reconstructing the data comprise estimating the cross-coupling coefficients in a first processing stage, and canceling the estimated cross-coupling interference in a second processing stage subsequent to the first processing stage.

8. The method according to claim 7, wherein estimating the cross-coupling coefficients and reconstructing the data comprise using the estimated cross-coupling coefficients for subsequent instances of the second processing stage.

9. The method according to claim 8, and comprising repeating the first processing stage only upon failure to reconstruct the data.

10. The method according to claim 1, wherein storing the data comprises encoding the data using an Error Correcting Code (ECC), wherein reconstructing the data comprises computing error correction metrics based on the estimated cross-coupling coefficients and decoding the ECC using the error correction metrics.

11. A method for operating a memory, comprising:
storing data in a group of analog memory cells of the memory as respective first voltage levels;
after storing the data, reading from the analog memory cells respective second voltage levels, which are affected by cross-coupling interference causing the second voltage levels to differ from the respective first voltage levels;
estimating cross-coupling coefficients, which quantify the cross-coupling interference among the analog memory cells by processing the second voltage levels; and
reconstructing the data stored in the group of analog memory cells from the read second voltage levels using the estimated cross-coupling coefficients.

12. The method according to claim 11, and comprising evaluating the cross-coupling interference caused by a first analog memory cell to a second analog memory cell in the memory based on both the second voltage level read from the first analog memory cell and on the second voltage level read from the second analog memory cell.

13. A data storage apparatus, comprising:
an interface, which is operative to communicate with a memory that includes a plurality of analog memory cells; and a memory signal processor (MSP), which is coupled to the interface and is arranged to store data in a group of the analog memory cells as respective first voltage levels selected from a set of possible values corresponding to respective possible combinations of data bits to be stored in the analog memory cells, to read from the analog memory cells, after storing the data, respective second voltage levels, which are affected by cross-coupling interference causing the second voltage levels to differ from the respective first voltage levels, to process the second voltage levels to derive respective hard decisions, each hard decision specifying a respective combination of the data bits selected from among the possible combinations of the data bits, to calculate respective differences between the second voltage levels that were read from the analog memory cells and the respective first voltage levels corresponding to the hard decisions, to estimate cross-coupling coefficients, which quantify the cross-coupling interference among the analog memory cells, based on the differences, and to reconstruct the data stored in the group of analog memory cells from the second voltage levels using the estimated cross-coupling coefficients.

14. The apparatus according to claim 13, wherein the MSP is arranged to estimate the cross-coupling coefficients by processing the second voltage levels and the respective hard decisions using a block estimation process.

15. The apparatus according to claim 13, wherein the MSP is arranged to estimate the cross-coupling coefficients by sequentially scanning the second voltage levels and the respective hard decisions using a sequential estimation process that converges to the cross-coupling coefficients.

16. The apparatus according to claim 13, wherein the MSP is arranged to apply an estimation process that reduces a distance metric between the read second voltage levels and the respective hard decisions.

17. The apparatus according to claim 13, wherein the MSP is arranged to evaluate the cross-coupling interference caused by a first analog memory cell to a second analog memory cell in the memory based on both the second voltage level read from the first analog memory cell and on the second voltage level read from the second analog memory cell.

18. The apparatus according to claim 13, wherein the MSP is arranged to remove the cross-coupling interference from the second voltage levels using one of a linear equalization process, a Decision-Feedback Equalization (DFE) process, a Maximum a Posteriori (MAP) estimation process and a Maximum-Likelihood Sequence Estimation (MLSE) process.

19. The apparatus according to claim 13, wherein the MSP is arranged to estimate the cross-coupling coefficients in a first processing stage, and to cancel the estimated cross-coupling interference in a second processing stage subsequent to the first processing stage.

20. The apparatus according to claim 19, wherein the MSP is arranged to use the estimated cross-coupling coefficients for subsequent instances of the second processing stage.

21. The apparatus according to claim 20, wherein the MSP is arranged to repeat the first processing stage only upon failure to reconstruct the data.

22. The apparatus according to claim 13, wherein the MSP is arranged to encode the data using an Error Correcting Code (ECC) before storing the data, to compute error correction metrics based on the estimated cross-coupling coefficients and to reconstruct the data by decoding the ECC using the error correction metrics.

23. A data storage apparatus, comprising:
an interface, which is operative to communicate with a memory that includes a plurality of analog memory cells; and
a memory signal processor (MSP), which is coupled to the interface and is arranged to store data in a group of the analog memory cells of the memory as respective first voltage levels, to read from the analog memory cells, after storing the data, respective second voltage levels, which are affected by cross-coupling interference causing the second voltage levels to differ from the respective first voltage levels, to estimate cross-coupling coefficients, which quantify the cross-coupling interference among the analog memory cells by processing the second voltage levels, and to reconstruct the data stored in the group of analog memory cells from the read second voltage levels using the estimated cross-coupling coefficients.

24. The apparatus according to claim 23, wherein the MSP is arranged to evaluate the cross-coupling interference caused by a first analog memory cell to a second analog memory cell in the memory based on both the second voltage level read from the first analog memory cell and on the second voltage level read from the second analog memory cell.

25. A data storage apparatus, comprising:
a memory, which comprises a plurality of analog memory cells; and
a memory signal processor (MSP), which is coupled to the memory and is arranged to store data in a group of the analog memory cells as respective first voltage levels selected from a set of possible values corresponding to respective possible combinations of data bits to be stored in the analog memory cells, to read from the analog memory cells, after storing the data, respective second voltage levels, which are affected by cross-coupling interference causing the second voltage levels to differ from the respective first voltage levels, to process the second voltage levels to derive respective hard decisions, each hard decision specifying a respective combination of the data bits selected from among the possible combinations of the data bits, to calculate respective differences between the second voltage levels that were read from the analog memory cells and the respective first voltage levels corresponding to the hard decisions, to estimate cross-coupling coefficients, which quantify the cross-coupling interference among the analog memory cells, based on the differences, and to reconstruct the data stored in the group of analog memory cells from the second voltage levels using the cross-coupling coefficients.

26. A data storage apparatus, comprising:
a memory, which comprises a plurality of analog memory cells; and
a memory signal processor (MSP), which is coupled to the memory and is arranged to store data in a group of the analog memory cells of the memory as respective first voltage levels, to read from the analog memory cells, after storing the data, respective second voltage levels, which are affected by cross-coupling interference causing the second voltage levels to differ from the respective first voltage levels, to estimate cross-coupling coefficients, which quantify the cross-coupling interference among the analog memory cells by processing the second voltage levels, and to reconstruct the data stored in the group of analog memory cells from the read second voltage levels using the estimated cross-coupling coefficients.

* * * * *